(12) United States Patent
Pulugurtha et al.

(10) Patent No.: US 11,839,073 B2
(45) Date of Patent: Dec. 5, 2023

(54) MEMORY DEVICE HAVING 2-TRANSISTOR VERTICAL MEMORY CELL

(71) Applicant: Micron Technology, Inc., Boise, ID (US)

(72) Inventors: Srinivas Pulugurtha, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/961,282

(22) Filed: Oct. 6, 2022

(65) Prior Publication Data

US 2023/0030364 A1    Feb. 2, 2023

Related U.S. Application Data

(63) Continuation of application No. 17/146,043, filed on Jan. 11, 2021, now Pat. No. 11,581,319, which is a
(Continued)

(51) Int. Cl.
*G11C 11/408*    (2006.01)
*H10B 12/00*    (2023.01)
(Continued)

(52) U.S. Cl.
CPC .......... *H10B 12/50* (2023.02); *G11C 11/4097* (2013.01); *H10B 12/01* (2023.02);
(Continued)

(58) Field of Classification Search
CPC ........ H10B 12/50; H10B 12/01; H10B 12/00; G11C 11/4097; G11C 11/408;
(Continued)

(56) References Cited

U.S. PATENT DOCUMENTS 5,357,464 A    10/1994    Shukuri et al.
6,396,745 B1    5/2002    Hong et al.
(Continued)

FOREIGN PATENT DOCUMENTS

| CN | 113330565 A | 8/2021 |
|---|---|---|
| WO | WO-2018182725 A1 | 10/2018 |
| WO | WO-2020139761 A1 | 7/2020 |

OTHER PUBLICATIONS

"International Application Serial No. PCT/US2019/067866, International Preliminary Report on Patentability dated Jul. 8, 2021", 8 pgs.
(Continued)

*Primary Examiner* — Xiaochun L Chen
(74) *Attorney, Agent, or Firm* — Schwegman Lundberg & Woessner, P.A.

(57) ABSTRACT

Some embodiments include apparatuses and methods of forming the apparatuses. One of the apparatuses includes a memory cell, first, second, and third data lines, and first and second access lines. Each of the first, second, and third data lines includes a length extending in a first direction. Each of the first and second access lines includes a length extending in a second direction. The memory cell includes a first transistor including a charge storage structure, and a first channel region electrically separated from the charge storage structure, and a second transistor including a second channel region electrically coupled to the charge storage structure. The first data line is electrically coupled to the first channel region. The second data line is electrically coupled to the first channel region. The third data line is electrically coupled to the second channel region, the second channel region being between the charge storage structure and the third data line. The first access line is located on a first level of the apparatus and separated from the first channel by a first dielectric. The second access line is located on a second
(Continued)

level of the apparatus and separated from the second channel by a second dielectric. The charge storage structure is located on a level of the apparatus between the first and second levels.

19 Claims, 30 Drawing Sheets

Related U.S. Application Data continuation of application No. 16/722,813, filed on Dec. 20, 2019, now Pat. No. 10,892,264.

(60) Provisional application No. 62/785,154, filed on Dec. 26, 2018.

(51) Int. Cl.
 *G11C 11/4097* (2006.01)
 *G11C 11/4093* (2006.01)
 *G11C 11/4091* (2006.01)

(52) U.S. Cl.
 CPC ......... *G11C 11/408* (2013.01); *G11C 11/4091* (2013.01); *G11C 11/4093* (2013.01)

(58) Field of Classification Search
 CPC ............ G11C 11/4091; G11C 11/4093; G11C 11/403; G11C 11/4076
 See application file for complete search history.

(56) References Cited

U.S. PATENT DOCUMENTS

| | | |
|---|---|---|
| 7,282,761 B2 * | 10/2007 | Ahn .................. H01L 29/40114 257/329 |
| 10,892,264 B2 | 1/2021 | Pulugurtha et al. |
| 2009/0147576 A1 | 6/2009 | Matamis et al. |
| 2012/0153371 A1 | 6/2012 | Chen et al. |
| 2013/0256774 A1 | 10/2013 | Jeon et al. |
| 2017/0271338 A1 | 9/2017 | Yamazaki et al. |
| 2018/0061834 A1 | 3/2018 | Derner et al. |
| 2020/0091156 A1 | 3/2020 | Sharma et al. |
| 2020/0212050 A1 | 7/2020 | Pulugurtha et al. |
| 2021/0272965 A1 | 9/2021 | Pulugurtha et al. |

OTHER PUBLICATIONS

"International Application Serial No. PCT/US2019/067866, International Search Report dated Apr. 22, 2020", 4 pgs.
"International Application Serial No. PCT/US2019/067866, Written Opinion dated Apr. 22, 2020", 5 pgs.

\* cited by examiner

MEMORY DEVICE HAVING 2-TRANSISTOR VERTICAL MEMORY CELL

PRIORITY APPLICATION

This application is a continuation of U.S. application Ser. No. 17/146,043, filed Jan. 11, 2021, which is a continuation of U.S. application Ser. No. 16/722,813, filed Dec. 20, 2019, which claims the benefit of priority to U.S. Provisional Application Ser. No. 62/785,154, filed Dec. 26, 2018, all of which are incorporated herein by reference in their entirety.

BACKGROUND

Memory devices are widely used in computers and many other electronic items to store information. Memory devices are generally categorized into two types: volatile memory device and non-volatile memory device. An example of a volatile memory device includes a dynamic random-access memory (DRAM) device. An example of a non-volatile memory device includes a flash memory device (e.g., a flash memory stick). A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. The described memory device can include a signal access line to control two transistors of a memory cell. This can lead to reduced power dissipation and improved processing. Other improvements and benefits of the described memory device and its variations are discussed below with reference to FIG. 1 through FIG. 19B.

Figure 1:
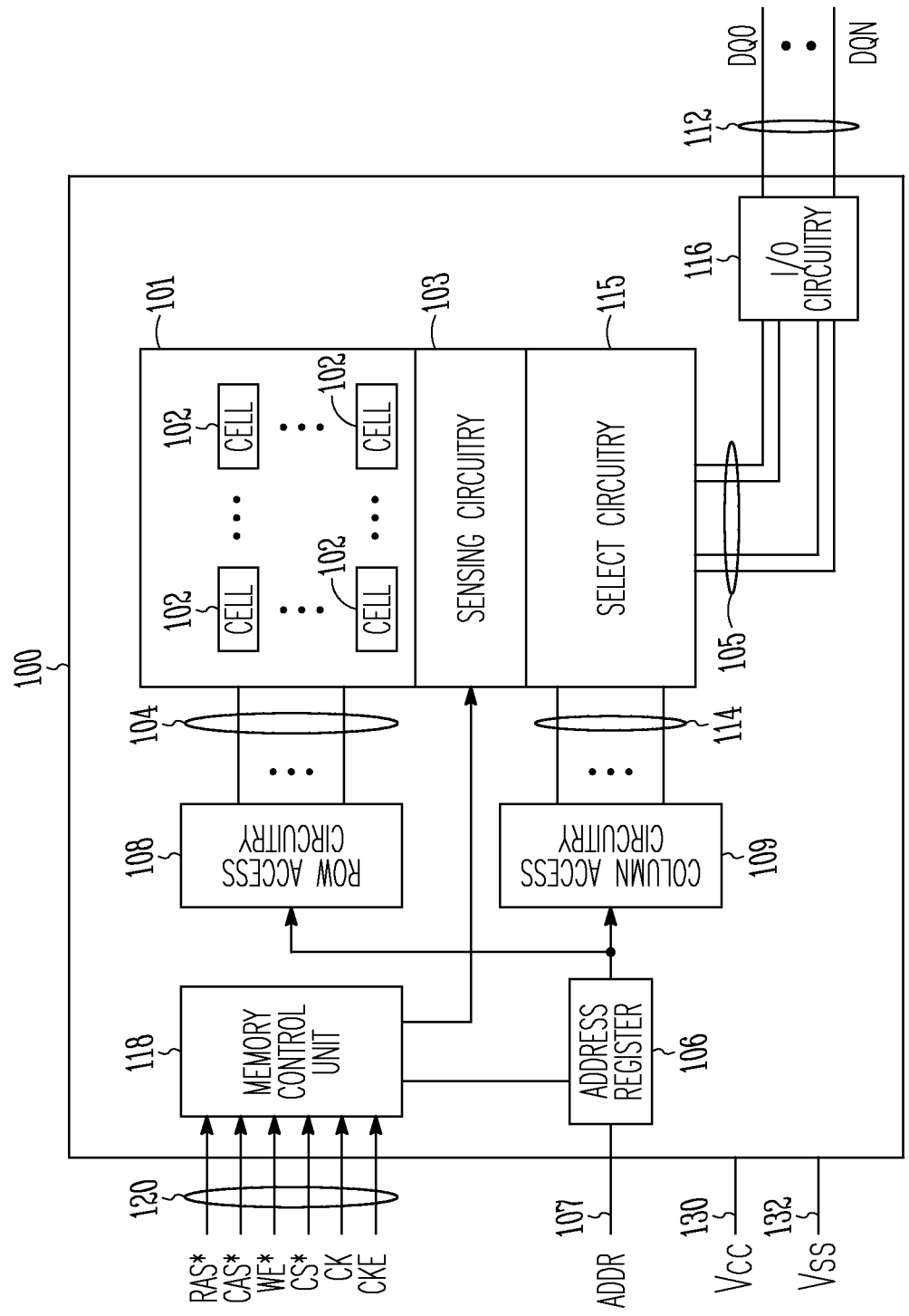
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 is a volatile memory device (e.g., a DRAM device), such that memory cells 102 are volatile memory cells. Thus, information stored in memory cells 102 may be lost (e.g., invalid) if supply power (e.g., supply voltage Vcc) is disconnected from memory device 100. Hereinafter, Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on Vcc, such an internal voltage may be used instead of Vcc.

In a physical structure of memory device 100, each of memory cells 102 can include transistors (e.g., two transistors) formed vertically in different levels (e.g., stacked one over the other in different layers) over a substrate (e.g., a semiconductor substrate) of memory device 100. The structure of memory array 101, including memory cells 102, can include the structure of memory arrays and memory cells described below with reference to FIG. 2 through FIG. 19B.

As shown in FIG. 1, memory device 100 can include access lines (e.g., word lines) 104 and data lines (e.g., bit lines) 105. Memory device 100 can use signals (e.g., word line signals) on access lines 104 to access memory cells 102 and on data lines 105 to provide information (e.g., data) to be stored in (e.g., written to) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., an X-decoder) 108 and column access circuitry (e.g., a Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1")), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of the information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 2 through FIG. 19B.

Figure 2:
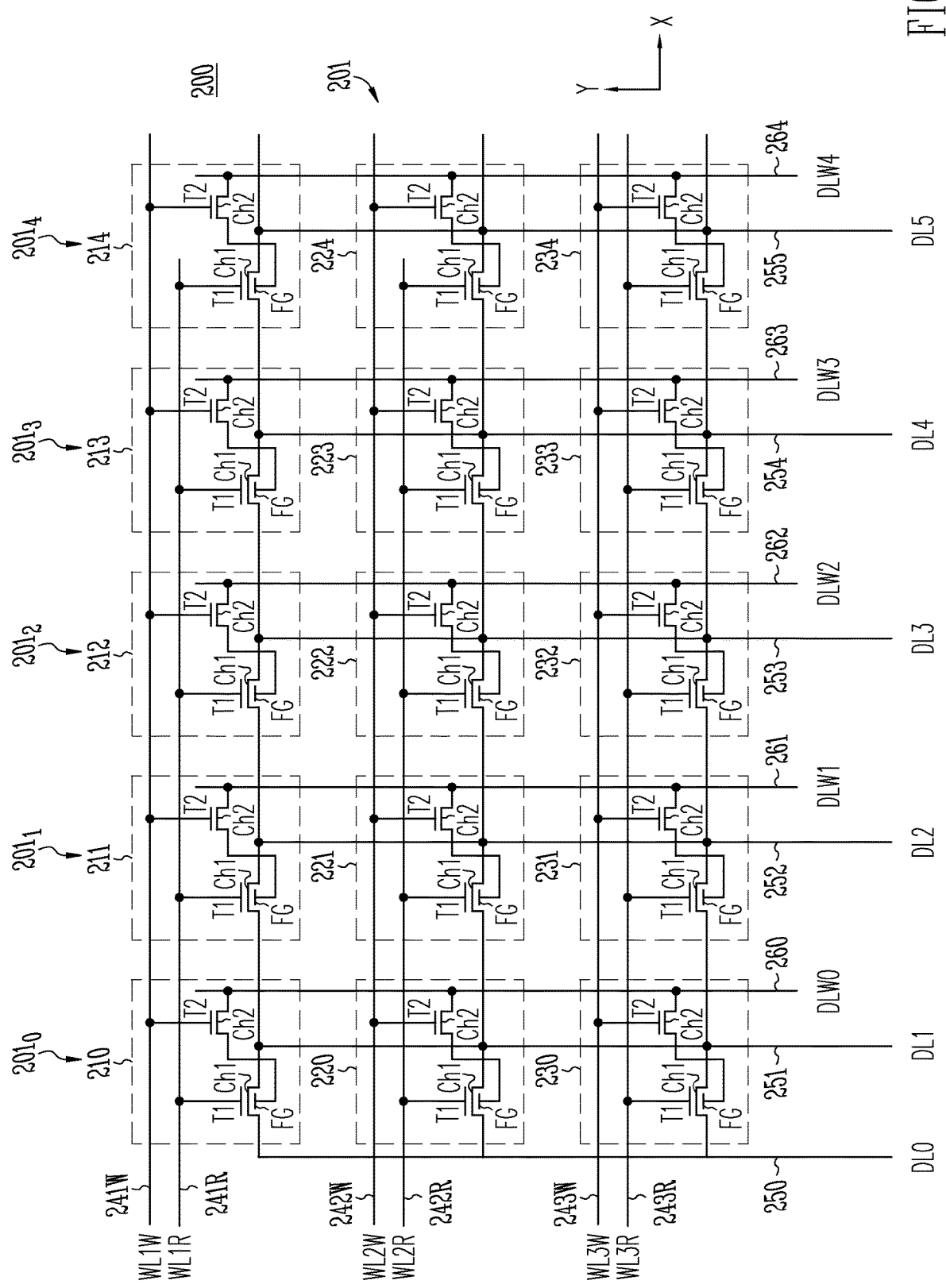
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 214, 220 through 224, and 230 through 234, which are volatile memory cells (e.g., DRAM cells). For simplicity, similar or identical elements among memory cells 210 through 214, 220 through 224, and 230 through 234 are given the same labels. Also for simplicity, memory cells 210 through 214, 220 through 224, and 230 through 234 are sometimes collectively referred to as "the memory cells" of memory device 200.

Each of the memory cells of memory device 200 can include two transistors T1 and T2. Thus, each of the memory cells of memory device 200 can be called a 2T memory cell (e.g., 2T gain cell). Each of transistors T1 and T2 can include a field-effect transistor (FET). Transistor T1 can include a charge storage-based structure (e.g., a floating gate-based structure). As shown in FIG. 2, each of memory cells 210 through 214 can include a charge storage structure FG, which can include the floating gate of transistor T1. Charge storage structure FG can form the memory element of a respective memory cell among memory cells 210 through 214. Charge storage structure FG can store charge. The value (e.g., "0" or "1") of information stored in a particular memory cell among memory cells 210 through 214 can be based on the amount of charge in charge storage structure FG of that particular memory cell.

Transistor T1 can includes a channel region Ch1. Transistor T2 can include a channel region Ch2. In the physical structure of memory device 200, each of channel regions Ch1 and Ch2 can include a structure of semiconductor material (e.g., a pie of semiconductor material (e.g., a layer of silicon or polysilicon)).

In each of the memory cells of memory device 200, transistor T1 can have a source terminal (not labeled in FIG. 2) and a drain terminal (not labeled in FIG. 2) in which channel region Ch1 is electrically coupled between the source and drain terminals. In a physical structure of memory device 200, the source terminal, channel region Ch1, and the drain terminal of transistor T1 of each of the memory cells of memory device 200 can be formed from a single structure (e.g., a single piece) of the same material (e.g., material of the same conductivity type (e.g., either n-type or p-type).

In each of the memory cells of memory device 200, transistor T2 can have a source terminal (not labeled in FIG. 2) and a drain terminal (not labeled in FIG. 2) in which channel region Ch1 is electrically coupled between the source and drain terminals. In a physical structure of memory device 200, the source terminal, channel region Ch1, and the drain terminal of transistor T2 of each of the memory cells of memory device 200 can be formed from a single structure (e.g., a single piece) of the same material (e.g., material of the same conductivity type (e.g., either n-type or p-type).

As shown in FIG. 2, channel region Ch2 of transistor T2 of a particular memory cell among the memory cells of memory device 200 can be electrically coupled to (e.g., directly coupled to) charge storage structure FG of that particular memory cell. Thus, a circuit path (e.g., current path) can be formed directly between transistor T2 (e.g., between channel region Ch2 of transistor T2) of a particular memory cell and charge storage structure FG of that particular memory cell during an operation (e.g., a write operation) of memory device 200.

Channel region Ch1 of transistor T1 of a particular memory cell among the memory cells of memory device 200 can be electrically coupled to (e.g., directly coupled to) channel region Ch1 of transistor T1 of at least one (one or more) adjacent memory cell. For example, channel region Ch1 of transistor T1 of memory cell 212 can be electrically coupled to channel region Ch1 of transistor T1 of memory cell 211 and to channel region Ch1 of transistor T1 of memory cell 213.

As shown in FIG. 2, memory cells 210 through 214 can be arranged in memory cell groups $201_0$, $201_1$, $201_2$, $201_3$, and $201_4$ ($201_0$ through $201_4$). FIG. 2 shows five memory cell groups $201_0$ through $201_4$ as an example. However, memory device 200 can include more than five memory cell groups. Memory cell groups $201_0$ through $201_4$ can include the same number of memory cells among the groups. For example, memory cell group $201_0$ can include memory cells 210, 220, and 230. Memory cell group $201_1$ can include memory cells 211, 221, and 231. Memory cell group $201_2$ can include memory cells 212, 222, and 232. Memory cell group $201_3$ can include memory cells 213, 223, and 233. Memory cell group $201_4$ can include memory cells 214, 224, and 234. FIG. 2 shows three memory cells in each of memory cell groups $201_1$ through $201_4$ as an example. The number of memory cells in memory cell groups $201_1$ through $201_4$ can be different from three.

Memory device 200 can perform a write operation to store information in the memory cells and a read operation to read (e.g., sense) information from the memory cells. Memory device 200 can be configured to operate as a DRAM device. However, unlike some conventional DRAM devices that store information in a structure such as a container for a capacitor, memory device 200 can store information in the form of charge in charge storage structure FG (which can be a floating gate structure). As mentioned above, charge storage structure FG can include the floating gate of transistor T1. Thus, memory device 200 can be called a floating gate-based DRAM device.

As shown in FIG. 2, memory device 200 can include access lines (e.g., word lines) 241W, 242W, 243W, 241R, 242R, and 243R that can carry respective signals (e.g., word line signals) WL1W, WL2W, WL3W, WL1R, WL2R, and WL3R. Access lines (e.g., write word lines) 241W, 242W, and 243W, and access lines (e.g., read word lines) 241R, 242R, and 243R can be used to access memory cell groups $201_1$ through $201_4$. Each of access lines 241W, 242W, 243W, 241R, 242R, and 243R can be structured as at least one conductive line (e.g., one conductive or alternatively multiple conductive lines that can be electrically coupled (e.g., shorted) to each other).

Access lines 241W, 242W, 243W, 241R, 242R, and 243R can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a read operation, only one memory cell of the same memory cell group (memory cell group $201_0$, $201_1$, $201_2$, $201_3$, or $201_4$) can be selected at a time to read information from the selected memory cell. In a read operation, memory cells of different memory cell groups (e.g., memory cell groups $201_1$ through $201_4$) that share the same access line can be concurrently selected (or alternatively can be sequentially selected) to read information from the selected memory cells.

In a write operation, information can be stored in a selected memory cell (or selected memory cells). In a write operation, only one memory cell of the same memory cell group (memory cell group $201_0$, $201_1$, $201_2$, $201_3$, or $201_4$) can be selected at a time to store information in the selected memory cell. In a write operation, memory cells of different memory cell groups (e.g., memory cell groups $201_1$ through $201_4$) that share the same access line can be concurrently selected (or alternatively can be sequentially selected) to store information in the selected memory cells.

In memory device 200, the gate of each of transistors T1 and T2 can be part of (e.g., can form part of) a respective access line (e.g., a respective word line). As shown in FIG. 2, the gate of transistor T1 of each of memory cells 210 through 214 can be part of access line 241R. The gate of transistor T1 of each of memory cells 220 through 224 can be part of access line 242R. The gate of transistor T1 of each of memory cells 230 through 234 can be part of access line 243R.

The gate of transistor T2 of each of memory cells 210 through 214 can be part of access line 241W. The gate of transistor T2 of each of memory cells 220 through 224 can be part of access line 242W. The gate of transistor T2 of each of memory cells 230 through 234 can be part of access line 243W.

Memory device 200 can include data lines (e.g., read data lines, also called read digit lines) 250, 251, 252, 253, 254, and 255 that can carry respective signals (e.g., read data line signals, also called read digit line signals) DL0, DL1, DL2, DL3, DL4, and DL5, and data lines (e.g., write data lines, also called write digit lines) 260, 261, 262, 263, and 264 that can carry respective signals (e.g., write data line signals, also called write digit line signals) DLW0, DLW1, DLW2, DLW3, and DLW4. Each of data lines 250 through 255 and 260 through 264 can be structured as a conductive line.

A data line can be a common data line (e.g., shared data line) for memory cells of the same memory cell group. For example, in memory cell group $201_0$, data lines (e.g., read data lines) 250 and 251 can be shared by memory cells 210, 220, and 230, and data line (e.g., write data line) 260 can be shared by memory cells 210, 220, and 230.

During a read operation, memory device 200 can selectively use data lines 250 through 255 to obtain information read (e.g., sensed) from selected memory cells of memory cell groups $201_0$ through $201_4$. During a write operation, memory device 200 can use data lines 260 through 264 to provide information to be stored in selected memory cells of memory cell groups $201_0$ through $201_4$.

Memory device 200 can include read paths (e.g., circuit paths). Information read from a selected memory cell during a read operation can be obtained through a read path coupled to the selected memory cell. A read path of a particular memory cell can include a current path (e.g., read current path) through channel region Ch1 of transistor T1 of that particular memory cell and two read data lines that are coupled (e.g., directly coupled) to channel region Ch1 of transistor T1 of that particular memory cell. For example, each of memory cells 210, 220, and 230 can include a read path that includes a current path through channel region Ch1 of transistor T1 of a respective memory cell among memory cells 210, 220, and 230 and data lines (e.g., read data lines) 250 and 251. In another example, each of memory cells 211, 221, and 231 can include a read path that includes a current path through channel region Ch1 of transistor T1 of a respective memory cell among memory cells 211, 221, and 231 and data lines (e.g., read data line) 251 and 252. Since transistor T1 can be used in a read path to read information from the respective memory cell during a read operation, transistor T1 can be called a read transistor and channel region Ch1 of transistor T1 can be called a read channel region.

Memory device 200 can include write paths (e.g., circuit paths). Information to be stored in a selected memory cell during a write operation can be provided to the selected memory cell through a write path coupled to the selected memory cell. A write path of a particular memory cell can include a current path (e.g., write current path) through channel region Ch2 of transistor T2 of that particular memory cell and a data line that is coupled (e.g., directly coupled) to channel region Ch2 of transistor T2 of that particular memory cell. For example, each of memory cells 210, 220, and 230 can include a write path that includes a current path through channel region Ch2 of transistor T2 of a respective memory cell among memory cells 210, 220, and 230 and data line (e.g., write data line) 260. In another example, each of memory cells 211, 221, and 231 can include a write path that includes a current path through channel region Ch2 of transistor T2 of a respective memory cell among memory cells 211, 221, and 231 and data line (e.g., write data line) 261. Since transistor T2 can be used in a write path to store information in a respective memory cell during a write operation, transistor T2 can be called a write transistor and the channel region of transistor T2 can be called a write channel region.

Each of transistors T1 and T2 can have a threshold voltage (Vt). Transistor T1 has a threshold voltage Vt1. Transistor T2 has a threshold voltage Vt2. During a write operation, transistor T2 of a particular memory cell (e.g., a selected memory cell) can be controlled (e.g., turned on) to pass information (to be stored in that particular memory cell) from a respective write data line to charge storage structure FG of that particular memory cell.

During a read operation, transistor T1 of a particular memory cell (e.g., selected memory cell) can be controlled (e.g., turned on) to pass information (e.g., previously stored information) from that particular memory cell to respective data lines coupled to the transistor T1 of that particular memory cell. In the connection of memory device 200 of FIG. 2, charge storage structure FG of transistor T1 can be referred to as a "back gate" of transistor T1. In a read operation to read (e.g., sense) information from a selected memory cell, threshold voltage Vt1, transistor T1 of the selected memory cell can be toggled by the bias of charge storage structure FG (e.g., the back gate) of transistor T1. The connection of charge storage structure FG of transistor T1 and transistor T2 of memory device 200 (as shown in FIG. 2) can help using a relatively lower operating bias voltage to control transistor T1 of a selected memory cell, thereby potentially leading to saving in power consumption of memory device 200.

The memory cells of memory device 200 can be divided (e.g., logically divided) into even memory cells and odd memory cells. In the physical structure of memory device 200, the memory cells (e.g., memory cells sharing the same access lines) can be located next to each other, such that even memory cells are interleaved with odd memory cells (and vice versa). For example, an even memory cell can be located immediately between two odd memory cells, and an odd memory cell can be located immediately between two even memory cells. As an example, in FIG. 2, memory cells 210, 212, 214, 220, 222, 224, 230, 232, and 234 can be referred to as even memory cells, and memory cells 211, 213, 221, 223, 231, and 233 can be referred to as odd memory cells.

Even memory cells can include memory cells that are located at even locations (e.g., locations associated with even addresses). Odd memory cells can include memory cells that are located at odd addresses (e.g., locations associated with odd addresses). The terms "even" (e.g., as used in "even memory cells" and "odd" (e.g., as used in odd memory cells) are used as a convenience to distinguish a portion of memory cells of memory device 200 from another portion of memory cells of memory device 200. However, terms "even" and "odd" can be interchanged with each other.

In a read operation, memory device 200 can access even memory cells during a time interval to read information from the even memory cells and access odd memory cells during another time interval to read information from the odd memory cells. In the same read operation, even memory cells can be accessed and read before odd memory cells are accessed and read. Alternatively, in the same read operation, odd memory cells can be accessed and read before even memory cells are accessed and read.

Figure 3:
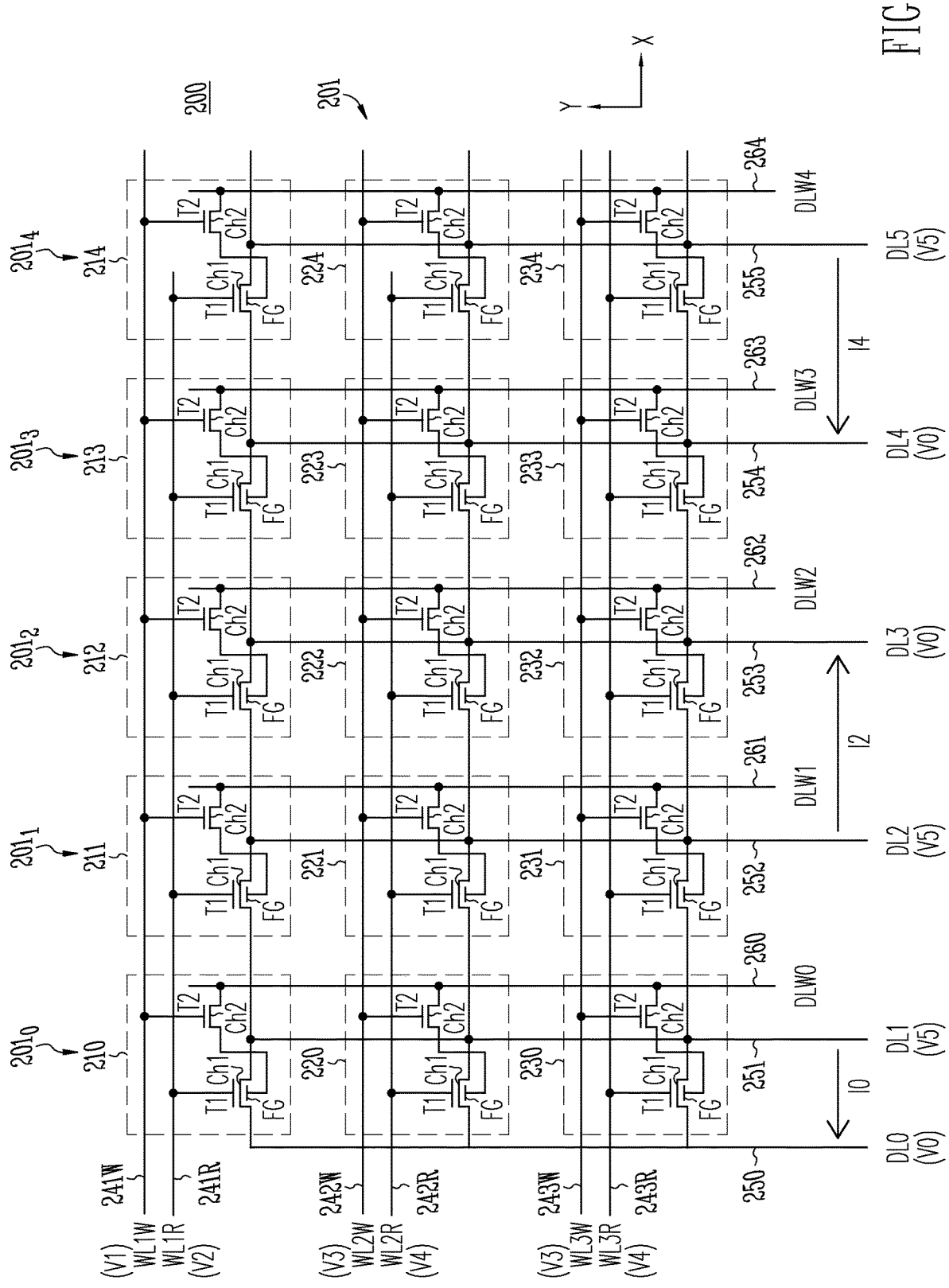
FIG. 3 shows the memory device of FIG. 2, including example voltages used during a read operation of even memory cells of the memory device, according to some embodiments described herein.

FIG. 3 shows memory device 200 of FIG. 2, including example voltages V0, V1, V2, V3, V4 and V5 used during a read operation of even memory cells, according to some embodiments described herein. The example of FIG. 3 assumes that memory cells 210, 212, and 214 are even memory cells and selected memory cells (e.g., target memory cells) during a read operation to read (e.g., to sense) information stored (e.g., previously stored) in memory cells 210, 212, and 214. Other memory cells (the memory cells of memory device 200 in FIG. 3 excluding memory cells 210, 212, and 214) are assumed to be unselected memory cells. This means that these unselected memory cells are not accessed, and information stored in unselected memory cells is not read, while information is read from memory cells (selected memory cells) 210, 212, and 214 in the example of FIG. 3.

In FIG. 3, voltages V0, V1, V2, V3, V4 and V5 can represent different voltages applied to access lines 241W, 241R, 242W, 242R, 243W, and 243R, and data lines (e.g., read data lines) 250 through 255 during a read operation of memory device 200. Each of currents (e.g., read current) I0, I2, and I4 can represent a current flowing through a respective read path that includes a selected memory cell and two respective data lines coupled to the selected memory cell. As shown in FIG. 3, current I0 can represent a current flowing through a read path that include data lines 250 and 251 and memory cell 210 (a selected memory cell in the example of FIG. 3). I2 can represent a current flowing through a read path that include data lines 252 and 253 and memory cell 212 (a selected memory cell in the example of FIG. 3). Current I4 can represent a current flowing through a read path that include data lines 254 and 255 and memory cell 214 (a selected memory cell in the example of FIG. 3).

In the read operation shown in FIG. 3, voltages V1, V2, V3, and V4 can have values such that transistors T1 and T2 of each of memory cells 220 through 224, and 230 through 234 (unselected memory cells in this example) are turned off (e.g., kept off).

Voltage V0 can have a value of 0V (e.g., ground) and voltage V5 can have a value (voltage value) to turn on transistor T1 of each of memory cells (selected memory cells) 210, 212, and 214 and turn off (or keep off) transistor T1 of each of memory cells 211 and 213. This allows information to be read from memory cells 210, 212, and 214.

Memory device 200 can determine the value (e.g., binary value) of information stored in memory cells 210, 212, and 214 based on the value (e.g., analog value) of currents I0, I2, and I4, respectively. For example, a detection circuitry (not shown) of memory device 200 can operate to translate the value of currents I0, I2, and I4 (or alternatively, the values of voltages on data lines 251, 252, and 255) into the value (e.g., "0", "1", or a combination of multi-bit values) of information read from the selected memory cells.

Figure 4:
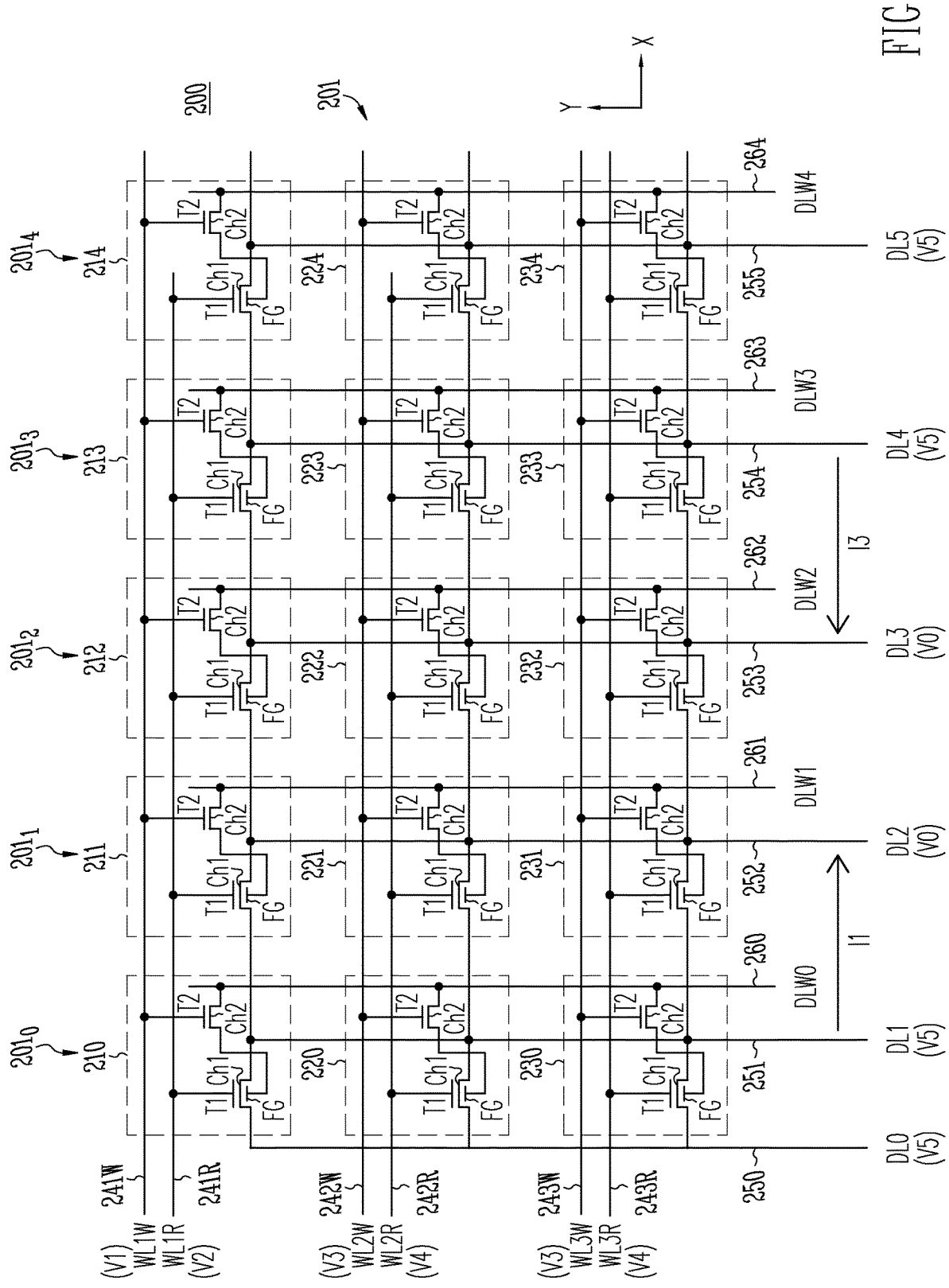
FIG. 4 shows the memory device of FIG. 2, including example voltages used during a read operation of odd memory cells of the memory device, according to some embodiments described herein.

FIG. 4 shows memory device 200 of FIG. 2, including example voltages V0, V1, V2, V3, V4 and V5 used during a read operation of odd memory cells, according to some embodiments described herein. The example of FIG. 4 assumes that memory cells 211 and 213 are odd memory cells and selected memory cells (e.g., target memory cells) during a read operation to read (e.g., to sense) information stored (e.g., previously stored) in memory cells 211 and 213. Other memory cells (the memory cells of memory device 200 in FIG. 4 excluding memory cells 211 and 213) are assumed to be unselected memory cells. This means that these unselected memory cells are not accessed, and information stored in unselected memory cells is not read, while information is read from memory cells (selected memory cells) 211 and 213 in the example of FIG. 4.

In FIG. 4, voltages V0, V1, V2, V3, V4 and V5 can represent different voltages applied to access lines 241W, 241R, 242W, 242R, 243W, and 243R, and data lines (e.g., read data lines) 250 through 255 during a read operation of memory device 200. Each of currents (e.g., read current) I1 and I3 can represent a current flowing through a respective read path that includes a selected memory cell and two respective data lines coupled to the selected memory cell. As shown in FIG. 4, current I1 can represent a current flowing through a read path that include data lines 251 and 252 and memory cell 211. Current I3 can represent a current flowing through a read path that include data lines 253 and 254 and memory cell 213.

In the read operation shown in FIG. 4, voltages V1, V2, V3, and V4 can have values such that transistors T1 and T2 of each of memory cells 220 through 224, and 230 through 234 (unselected memory cells in this example) are turned off (e.g., kept off).

Voltage V0 can have a value of 0V (e.g., ground) and voltage V5 can have a value (voltage value) to turn on transistor T1 of each of memory cells (selected memory cells) 211 and 213 and turn off (or keep off) transistor T1 of each of memory cells 210, 212, and 214. This allows information to be read from memory cells 211 and 213.

Memory device 200 can determine the value (e.g., binary value) of information read from memory cells 211 and 213 based on the value (e.g., analog value) of currents I1 and I3, respectively. For example, detection circuitry (not shown) of memory device 200 can operate to translate the value of currents I1 and I3 (or alternatively, the values of voltages on data lines 251 and 254) into the value (e.g., "0", "1", or a combination of multi-bit values) of information read from the selected memory cells.

The example read operations of FIG. 3 and FIG. 4 can be different read operations performed at different times. However, the example read operations of FIG. 3 and FIG. 4 can be part of the same read operation. In an example, memory cells 210, 211, 212, 213 and 214 can be selected memory cells. Thus, reading of memory cells 210, 212, and 214 can be performed before (or alternatively can be performed after) reading of memory cells 211 and 213.

Figure 5:
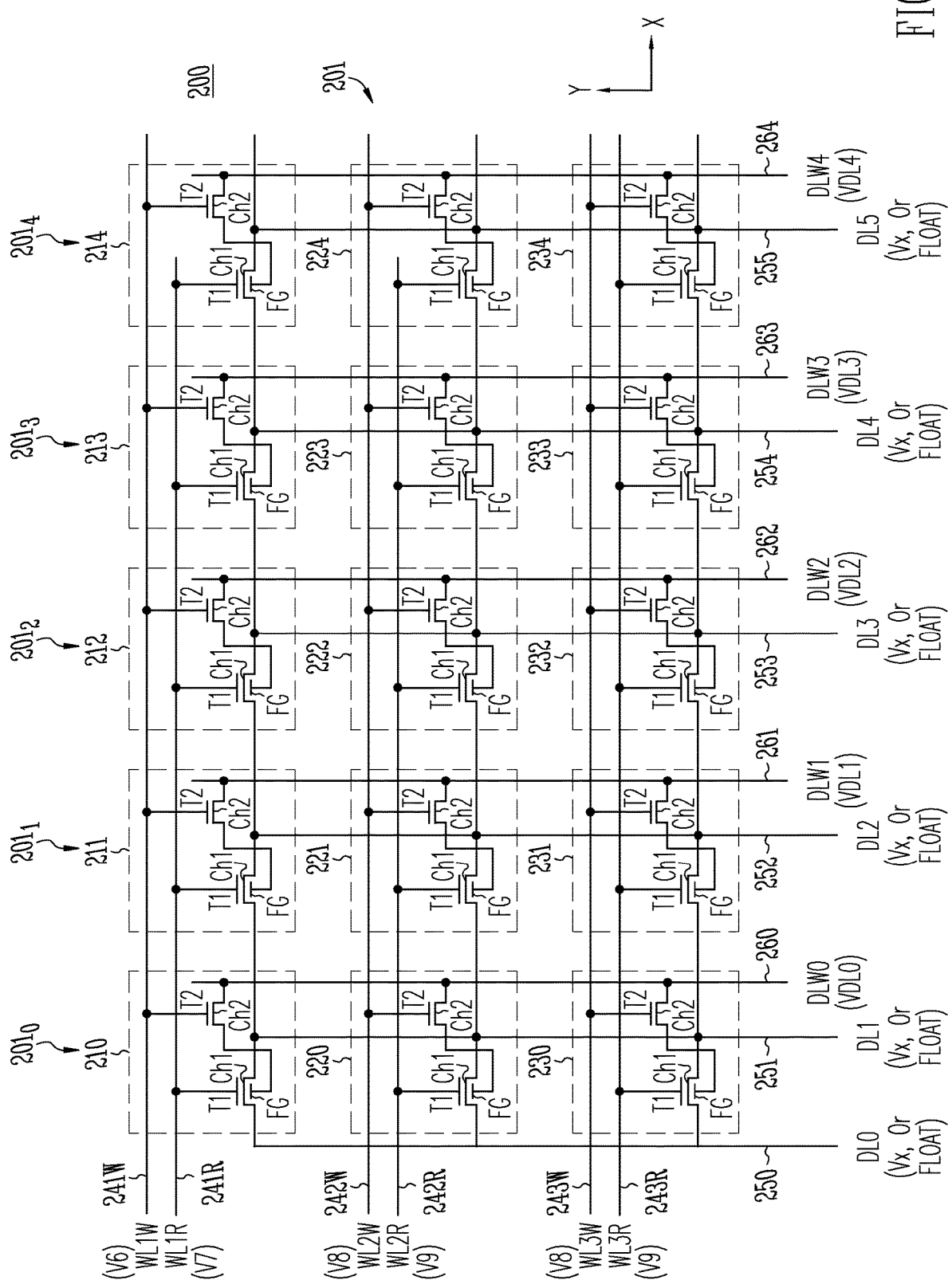
FIG. 5 shows the memory device of FIG. 2, including example voltages used during a write operation of the memory device, according to some embodiments described herein.

FIG. 5 shows the memory device of FIG. 2, including example voltages V6, V7, V8, V9, Vx, VDL0, VLD1, VDL2, VDL3, and VLD4 used during a write operation of the memory device, according to some embodiments described herein. The example of FIG. 5 assumes that memory cells 210, 211 212, 213, and 214 are selected memory cells (e.g., target memory cells) during a write operation to store information in memory cells 210, 211 212, 213, and 214. Memory cells 220 through 224 and 230 through 234 are assumed to be unselected memory cells. This means that memory cells 220 through 224 and 230 through 234 are not accessed, and information (e.g., new information) is not to be stored in memory cells 220 through 224 and 230 through 234, while information is stored in memory cells (selected memory cells) 210, 211 212, 213, and 214 in the example of FIG. 5.

In FIG. 5, voltages V6, V7, V8, V9, Vx, VDL0, VLD1, VDL2, VDL3, and VLD4 can represent different voltages applied to access lines 241W, 241R, 242W, 242R, 243W, and 243R, and data lines (e.g., write data lines) 260 through 264 during a write operation of memory device 200.

In the write operation shown in FIG. 5, voltages V6, V7, V8, and V9 can have values such that transistors T1 and T2 of each of memory cells 220 through 224, and 230 through 234 (unselected memory cells in this example) are turned off (e.g., kept off).

As shown in FIG. 5, each of data lines (e.g., read data lines) 250 through 255 can be either applied with voltage Vx or placed in a "FLOAT" condition. Voltage Vx can have a value of 0V (e.g., ground) or another value different from 0V. Placing a particular conductive line (e.g., data lines 250 through 255) in a FLOAT condition during a particular operation can include allowing the potential on that particular conductive line to vary or to "float" (e.g., by not coupling that particular conductive line to a fixed potential (e.g., ground or other voltages). In the example write operation of FIG. 5, each of data lines 250 through 255 can be placed in a FLOAT condition by, for example, decoupling each of data lines 250 through 255 from ground or from a fixed positive voltage source. This allows the potential on each of data 250 through 255 to vary (e.g., to "float") during the operation of storing information in memory cells 210 through 214 (selected memory cells in this example).

In the example write operation of FIG. 5, the values of voltages VDL0, VLD1, VDL2, VDL3, and VLD4 can be based on the value of information to be stored in memory cells 210, 211, 212, 213, and 214, respectively. For example, if information to be stored in memory cell 210 has one value (e.g., "0"), then voltage VDL0 can have one value (e.g., VDL0=0V). If information to be stored in memory cell 210 has another value (e.g., "1"), then voltage VDL0 can have another value (e.g., VDL0>0V). Similarly, each of voltages VLD1, VDL2, VDL3, and VLD4 can have different values (e.g., 0V and another value different from 0V) based on formation to be stored in a respective memory cell among memory cells 211, 212, 213, and 214.

During a write operation of FIG. 5, voltage V6 can have a value to turn on transistor T2 of each of memory cells 210 through and 214 (selected memory cells in this example) and form a write path between charge storage structure FG of each of memory cells 210 through 214 and a respective write data line among data lines 260 through 264. A current (e.g., write current) may be formed between charge storage structure FG of each of memory cells 210 through 214 and a respective write data line among data lines 260 through 264. This current can affect (e.g., change) the amount of charge on charge storage structure FG of memory cells 210 through 214 to reflect the value of information to be stored in memory cells 210 through 214.

In the example write operation of FIG. 5, the value of voltages VDL0, VLD1, VDL2, VDL3, and VLD4 may cause charge storage structure FG of memory cells 210, 211, 212, 213, and 224, respectively, to discharge or to be charged, such that the resulting charge (e.g., charge remaining after the discharge or charge action) on charge storage structure FG of a particular memory cell among memory cells 210, 211, 212, 213, and 224 can reflect the value of information stored in that particular.

Figure 6:
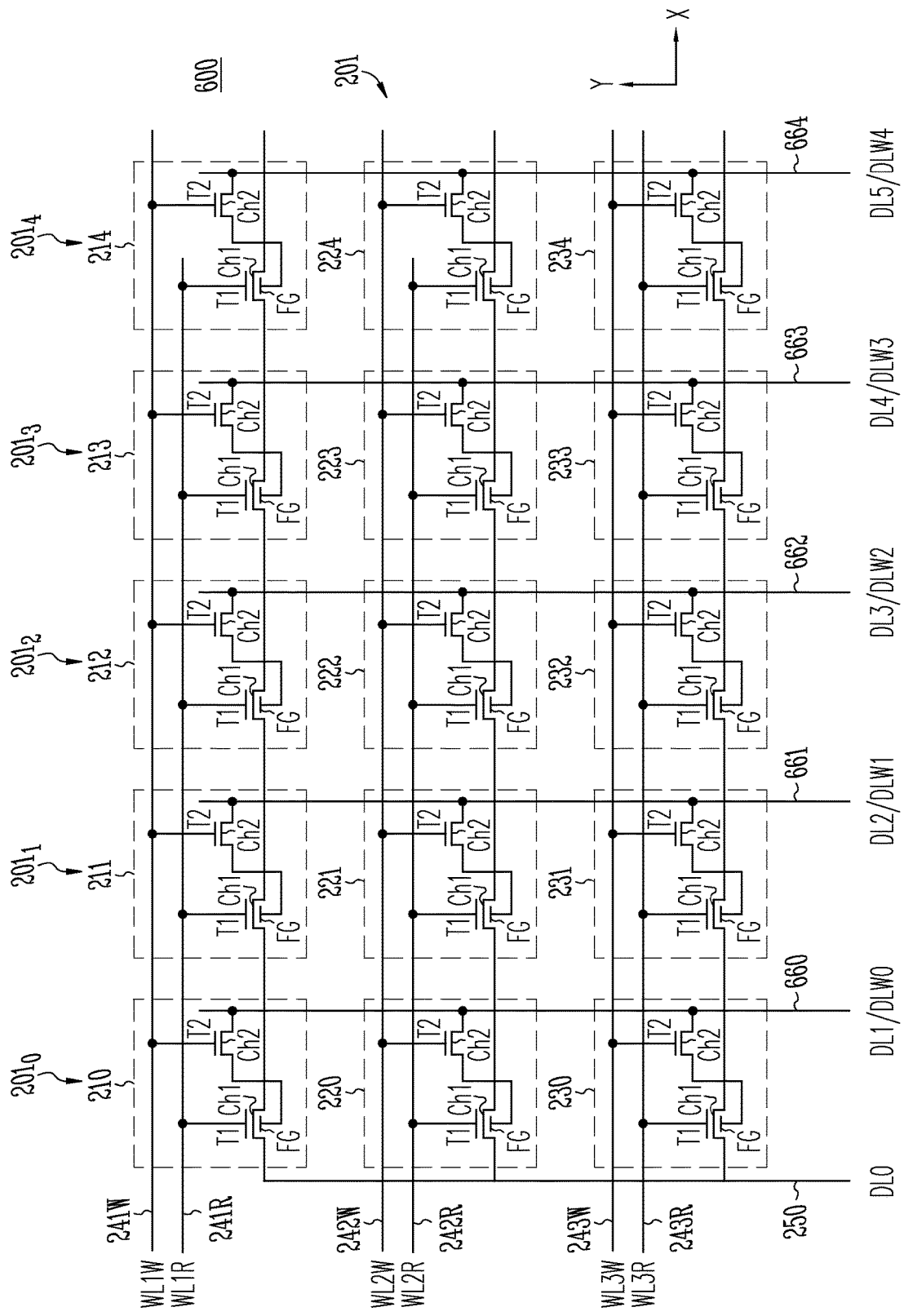
FIG. 6 shows a schematic diagram of a portion of a memory device including a shared read/write data line in each memory cell, according to some embodiments described herein.

FIG. 6 shows a schematic diagram of a portion of a memory device 600 including a shared read/write data line in each memory cell, according to some embodiments described herein. Memory device 600 can be a variation of memory device 200 of FIG. 2. Thus, for simplicity, similar or identical elements between memory devices 200 and 600 are given the same labels and their descriptions are not repeated.

As shown in FIG. 6, memory device 600 can include data lines (shared read/write data lines) 660, 661, 662, 663, 664, and 665 (660 through 660). Each of data lines 660 through 660 can be shared by transistors T1 and T2 of a respective memory cell. For example, data line (e.g., shared read/write data line) 660 can be shared by transistors T1 and T2 of each of memory cells 210, 220, and 230. Data line (e.g., shared read/write data line) 661 can be shared by transistors T1 and T2 of each of memory cells 211, 221, and 231. Data line (e.g., shared read/write data line) 662 can be shared by transistors T1 and T2 of each of memory cells 212, 222, and 232. Data line (e.g., shared read/write data line) 663 can be shared by transistors T1 and T2 of each of memory cells 213, 223, and 233. Data line (e.g., shared read/write data line) 664 can be shared by transistors T1 and T2 of each of memory cells 214, 224, and 234.

As shown in FIG. 6, data lines 660, 661, 662, 663, and 664 can be provided with signals DL1/DLW0, DL2/DLW1, DL3/DLW2, DL4/DLW3, and DL5/DLW4, respectively. During an operation (e.g., read or write operation) of memory device 600, signal DL1/DLW0 can be provided with voltages similar to or the same as the voltages described above with reference to FIG. 3 through FIG. 5. For example, during a read operation of memory device 600, signal DL1/DLW0 can be provided with a voltage similar to that provided to signal DL1 described above with reference to FIG. 2 and FIG. 3. In another example, during a write operation of memory device 600, signal DL1/DLW0 can be provided with a voltage similar to that provided to signal DLW0 described above with reference to FIG. 5. Similarly, signal DL2/DLW1, DL3/DLW2, DL4/DLW3, and DL5/DLW4 can be provided with voltages similar to (or the same as) those of FIG. 3, FIG. 4, and FIG. 5, depending on the operation (e.g., read or write operation) of memory device 600.

Figure 7:
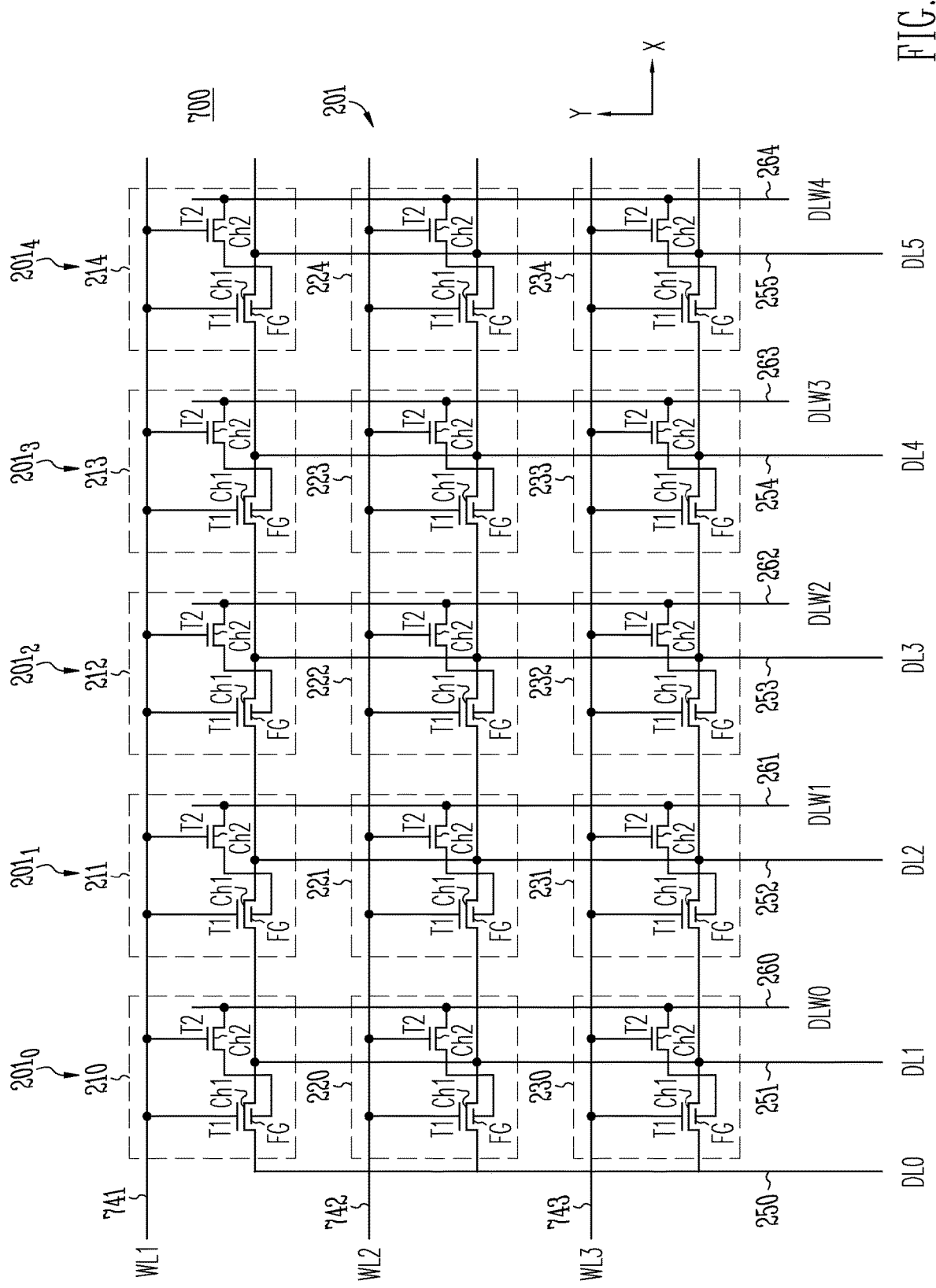
FIG. 7 shows a schematic diagram of a portion of a memory device including a shared access line for two transistors of each memory cell, according to some embodiments described herein.

FIG. 7 shows a schematic diagram of a portion of a memory device 700 including a shared access line for transistors T1 and T2 of each memory cell, according to some embodiments described herein. Memory device 700 can be a variation of memory device 200 of FIG. 2. Thus, for simplicity, similar or identical elements between memory devices 200 and 700 are given the same labels and their descriptions are not repeated.

As shown in FIG. 7, memory device 600 can include access lines (word lines) 741, 742, and 743. Each of access lines 741, 742, and 743 can be shared by transistors T1 and T2 of a respective memory cell, such that the same access line can be used to control (e.g., turn on or turn off) transistors T1 and T2 of a respective memory cell. For example, access line (e.g., shared access line) 741 can be shared by transistors T1 and T2 of each of memory cells 210, 211, 212, 213, and 214. This means that a single access line (e.g., access line 741) can be used to control (e.g., turn on or turn off) transistors T1 and T2 of memory cell 210. Similarly, access line 741 can be used to control (e.g., turn on or turn off) transistors T1 and T2 of each of memory cell 211, 212, 213, and 214.

In another example, access line (e.g., shared access line) 742 can be shared by transistors T1 and T2 of each of memory cells 220, 221, 222, 223, and 224. This means that a single access line (e.g., access line 742) can be used to control (e.g., turn on or turn off) transistors T1 and T2 of each of memory cells 220, 221, 222, 223, and 224.

In another example, access line (e.g., shared access line) 743 can be shared by transistors T1 and T2 of each of memory cells 230, 231, 232, 233, and 234. This means that a single access line (e.g., access line 742) can be used to control (e.g., turn on or turn off) transistors T1 and T2 of each of memory cells 230, 231, 232, 233, and 234.

As shown in FIG. 7, access lines 741, 742, and 743 can be provided with signals WL1, WL2, and WL3, respectively. Each of signals WL1, WL2, and WL3 can be provided with different voltages during different operations (e.g., read and write operations) of memory device 700.

As described above with reference to FIG. 2, transistor T1 can have threshold voltage Vt1, and transistor T2 can have a threshold voltage Vt2. In FIG. 7, the value of threshold voltages Vt1 and Vt2 and be different, so that a single access line (e.g., access line 741, 742, or 743) can be used to control transistors T1 and T2 of a respective memory cell. The value of threshold voltage Vt2 can be greater than the value of threshold voltage Vt2 (e.g. Vt2>Vt1).

During a read operation of memory device 700, signals WL1, WL2, and WL3, can be provided with voltages, such that transistor T1 of a selected memory cell (or selected memory cells) of memory device 700 can be turned on, and transistor T1 of each of unselected memory cells of memory device 700 are turned off (while transistor T1 of the selected memory cell is turned on). During a read operation of memory device 700, signals WL1, WL2, and WL3, can be provided with voltages, such that transistor T2 of each of memory cells (selected and unselected memory cells) of memory device 700 can be turned off. The voltages provided to signals WL1, WL2, and WL3 during a read operation can be similar to or the same as the voltage provided to signals WL1R, WL2R, and WL3R respectively, of FIG. 5.

As an example, if at least one of memory cells 210, 211, 212, 213, and 214 is selected during a read operation (to read information from the selected memory cell (or selected memory cells)), then signals WL1, WL2, and WL3 can be provided with voltages (e.g., access lines 741, 742, and 743 can be applied with voltages) such that transistor T2 of each of memory cells 210 through 214, 220 through 224, and 230 through 234 can be turned off, and transistor T1 of each of memory cells 220 through 224, and 230 through 234 can be turned off. In this example, signal WL1 can be provided a voltage, such that transistor T1 of a selected memory cell (or selected memory cells) among memory cells 210 through 214 can be turned on. This allows information to be read (e.g., sensed) from the selected memory cell (or selected memory cells) among memory cells 210 through 214.

During a write operation of memory device 700, signals WL1, WL2, and WL3 can be provided with voltages such that transistor T2 of a selected memory cell (or memory cells) of memory device 700 can be turned on and transistor T2 of each of unselected memory cells of memory device 700 are turned off (while transistor T2 of the selected memory cell is turned on). The voltages provided to signals WL1, WL2, and WL3 during a write operation can be similar to or the same as the voltage provided to signals WL1W, WL2W, and WL3W, respectively, of FIG. 5.

As an example, if at least one of memory cells 210, 211, 212, 213, and 214 is selected during a write operation (to store information in the selected memory cell (or selected memory cells)), then signals WL1, WL2, and WL3 can be provided with voltages (e.g., access lines 741, 742, and 743 can be applied with voltages) such that transistor T2 of each of memory cells 220 through 224, and 230 through 234 can be turned off. In this example, signal WL1 can be provided a voltage, such that transistor T2 of a selected memory cell (or selected memory cells) among memory cells 210 through 214 can be turned on. This allows information to be stored in the selected memory cell (or selected memory cells) among memory cells 210 through 214.

Figure 8:
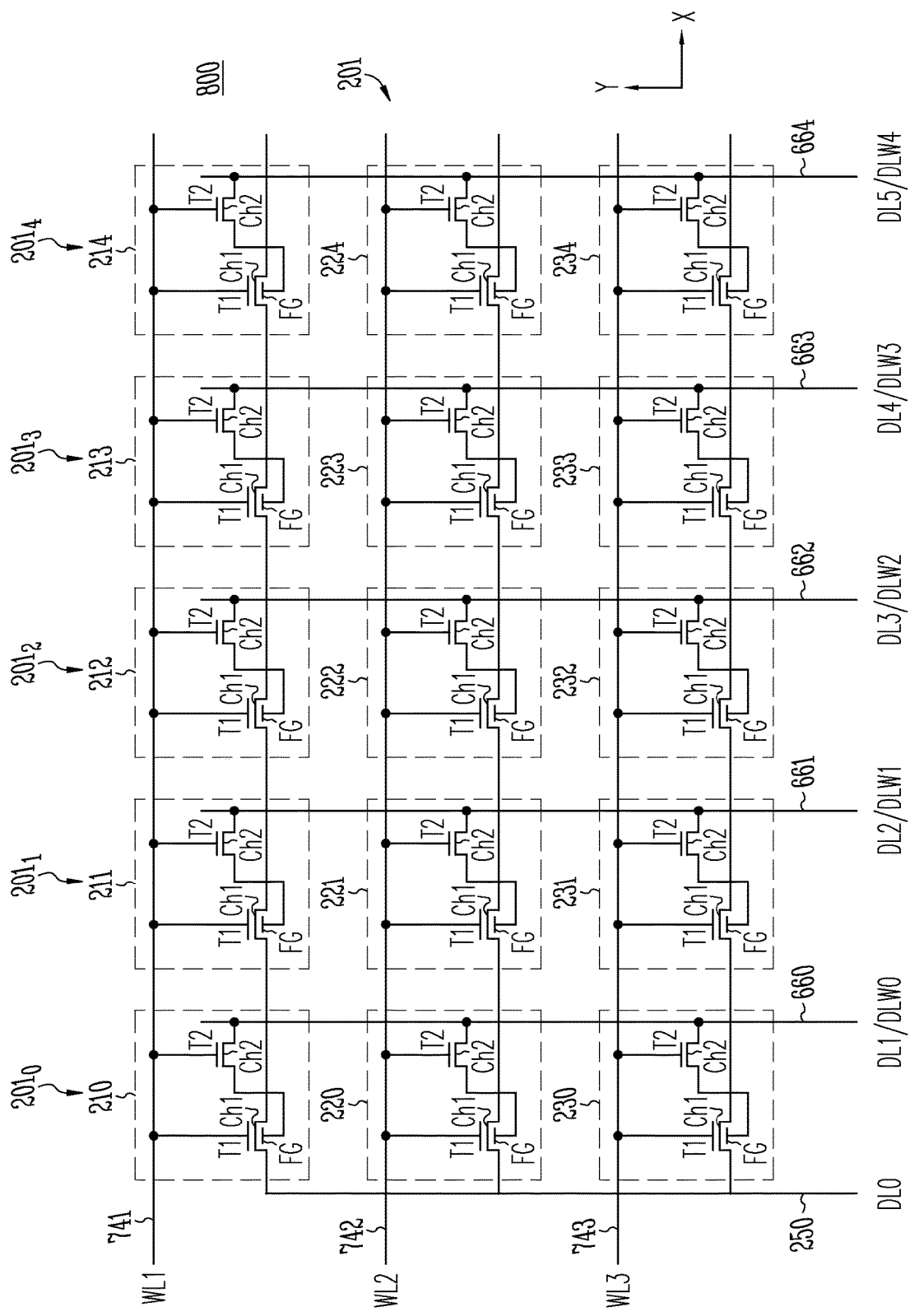
FIG. 8 shows a schematic diagram of a portion of a memory device including a shared read/write data line in each memory cell and a shared access line for two transistors of each memory cell, according to some embodiments described herein.

FIG. 8 shows a schematic diagram of a portion of a memory device 800, including a shared read/write data line in each memory cell and a shared access line for two transistors of each memory cell, according to some embodiments described herein. Memory device 800 can be a variation of at least one of memory device 200 (FIG. 2), memory device 600 (FIG. 6), and memory device 700 (FIG. 7). Thus, for simplicity, similar or identical elements between memory devices 200, 600, 700, and 800 are given the same labels and their descriptions are not repeated. As shown in FIG. 8, memory device 800 can include elements (e.g., a combination of elements) from a portion (e.g., shared read/write data lines) of memory device 600 of FIG. 6, and a portion of (e.g., shared access line for transistors T1 and T2 in each memory cell) of memory device 700 of FIG. 7. Memory device 800 can include operations (e.g., read and write operations) similar to (or the same as) those of the operations of memory devices 600 and 700 described above with reference to FIG. 6 and FIG. 7.

Figure 9:
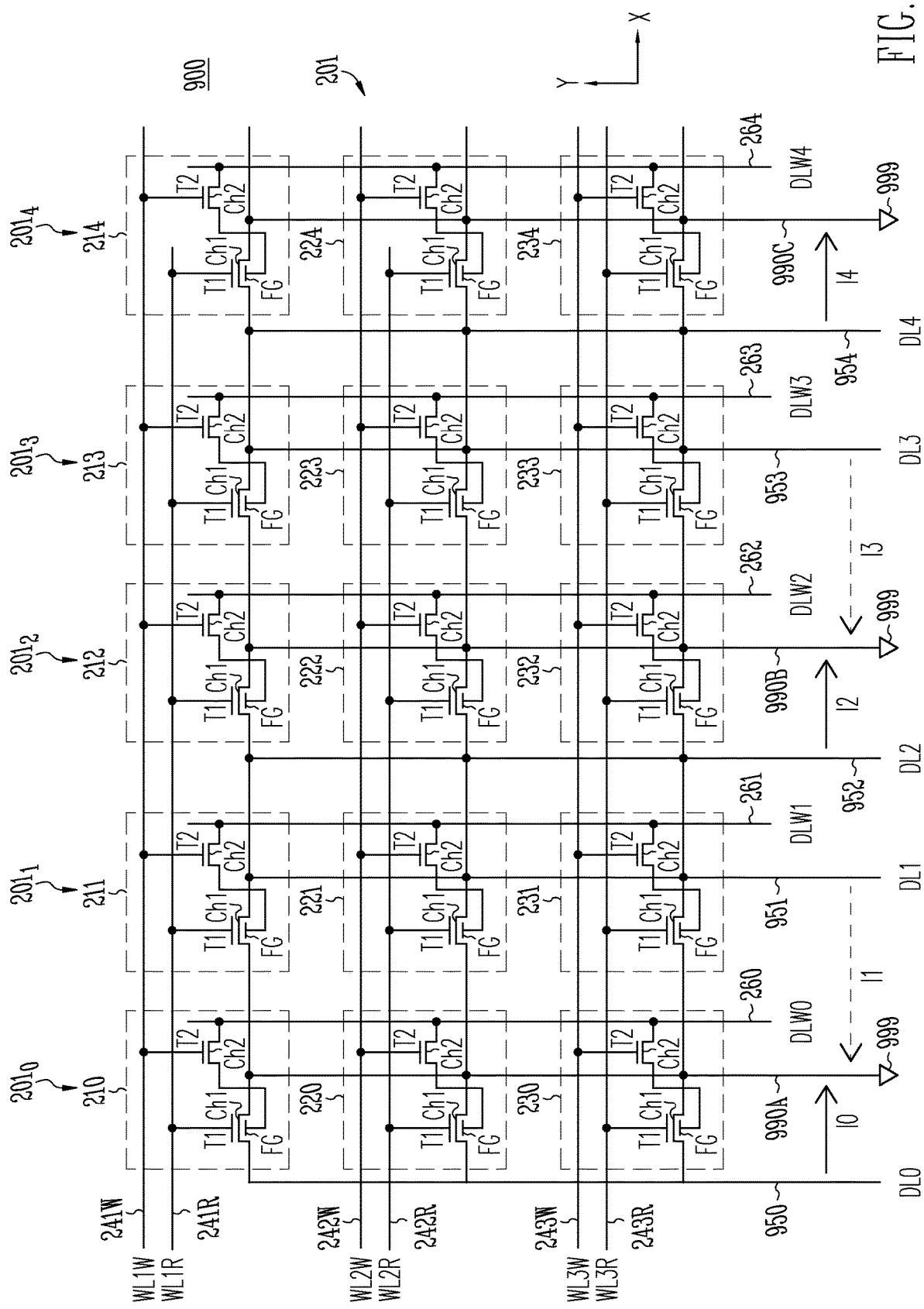
FIG. 9 shows a schematic diagram of a portion of a memory device including a ground connection in each memory cell, according to some embodiments described herein.

FIG. 9 shows a schematic diagram of a portion of a memory device 900, including a ground connection in each memory cell, according to some embodiments described herein. Memory device 900 can be a variation of memory device 200 of FIG. 2. Thus, for simplicity, similar or identical elements between memory devices 200 and 900 are given the same labels and their descriptions are not repeated.

As shown in FIG. 9, memory device 900 can include data lines (e.g., read data lines) 950, 951, 952, 953, and 954, conductive lines 990A, 990B, and 990C, and a ground connection (e.g., ground node) 999. Each of memory cells 210 through 214, 220 through 224, and 230 through 234 can include a terminal (e.g., a source terminal of transistor T1) that can be coupled (e.g., can be grounded) to ground connection 999 through a respective conductive line among conductive lines 990A, 990B, and 990C.

During a read operation, data lines 950, 951, 952, 953, and 954 can be provided with voltages (e.g., carried by signals DL0, DL1, DL2, DL3, and DL4, respectively) such that currents (e.g., either a combination of currents I0, I2, and I4 or a combination of currents I1 and I3) associated with selected memory cells may flow through read paths of respective selected memory cells. For example, if even memory cells are selected, then each of signals DL0, DL2, and DL4 can be provided with voltages having a positive value, and each of signals DL1 and DL3 can be provided with a voltage of 0V. In another example, if odd memory cells are selected, then each of signals DL1 and DL3 can be provided with voltages having a positive value, and each of signals DL0, DL2, and DL4 can be provided with a voltage of 0V.

Memory device 900 can perform a read operation to read information (e.g., previously stored information) from even memory cells and odd memory cells at different time intervals. Even memory cells can be read before or after reading of odd memory cells. In FIG. 9, a combination of even memory cells that can be read (e.g., read one combination at a time) during a read operation can include a combination of memory cells 210, 212 and 214, a combination of memory cells 220, 222 and 224, or a combination of memory cells 230, 232 and 234. A combination of odd memory cells that can be read (e.g., read one combination at a time) during a read operation can include a combination of memory cells 211 and 213, a combination of memory cells 221 and 223, or a combination of memory cells 231 and 233.

Currents I0, I2, and I4 in FIG. 9 can represent currents that flow in read paths of respective even memory cells that are selected during a read operation. Currents I1 and I3 can represent currents that flow in read paths of respective odd memory cells that are selected during a read operation. A read path can include a current path between one of data lines 950 through 954 and one of conductive lines 990A, 990B, and 990C. As mentioned above, even memory cells and odd memory cells can be selected one at a time (e.g., selected at different times). Thus, currents I0, I2, and I4 can occur at a time interval during reading of even memory cells, and current I1 and I3 can occur at another time interval during reading of odd memory cells.

For example, if memory cells (e.g., even memory cells) 210, 212, and 214 are selected during a read operation, then current I0 can represent current flowing in a read path including data line 950, transistor T1 of memory cell 210, and conductive line 990A; current I2 can represent current flowing in a read path including data line 952, transistor T1 of memory cell 212, and conductive line 990B; and current I4 can represent current flowing in a read path including data line 954, transistor T1 of memory cell 214, and conductive line 990C.

In another example, if memory cells (e.g., odd memory cells) 211 and 213 are selected during a read operation, then current I1 can represent current flowing in a read path including data line 951, transistor T1 of memory cell 211, and conductive line 990A, and current I3 can represent current flowing in a read path including data line 953, transistor T1 of memory cell 213, and conductive line 990B.

Memory device 900 can include a write operation similar to that of memory device 200. For example, memory device 900 can perform a write operation to store information in selected memory cells, in which the values of the information to be stored can be based on the values (e.g., voltage values) provided to signals DLW0, DLW1, DLW2, DLW3, and DLW4.

Figure 10:
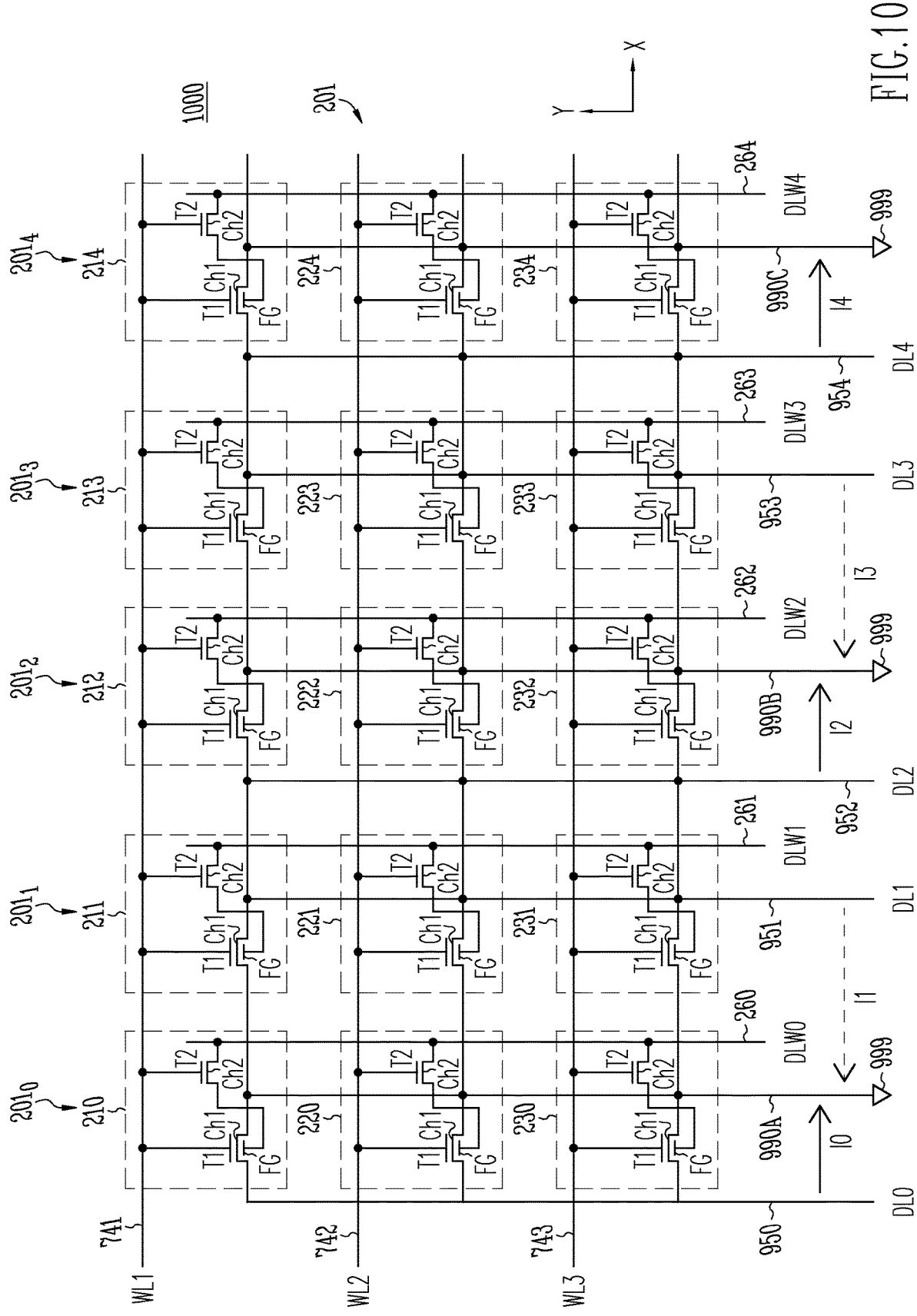
FIG. 10 shows a schematic diagram of a portion of a memory device including a ground connection in each memory cell and a shared access line for two transistors of each memory cell, according to some embodiments described herein.

FIG. 10 shows a schematic diagram of a portion of a memory device 1000 including a ground connection in each memory cell and a shared access line for transistors T1 and T2 of each memory cell, according to some embodiments described herein. Memory device 1000 can be a variation of at least one of memory device 200 (FIG. 2), memory device 700 (FIG. 7), and memory device 900 (FIG. 9). Thus, for simplicity, similar or identical elements between memory devices 200, 700, 900, and 1000 are given the same labels and their descriptions are not repeated. For example, like memory device 900 of FIG. 9, memory device 1000 can include memory cells in which each of the memory cells can include a terminal (e.g., a source terminal) coupled to ground connection 999. In another example, like memory device 700 of FIG. 7, transistors T1 and T2 of each of the memory cells of memory device 1000 can be controlled by a single access line (e.g., one of access lines 741, 742, and 743). Memory device 1000 can include operations (e.g., read and write operations) similar to (or the same as) those of the operations of memory devices 700 and 900 described above with reference to FIG. 7 and FIG. 9.

Figure 11:
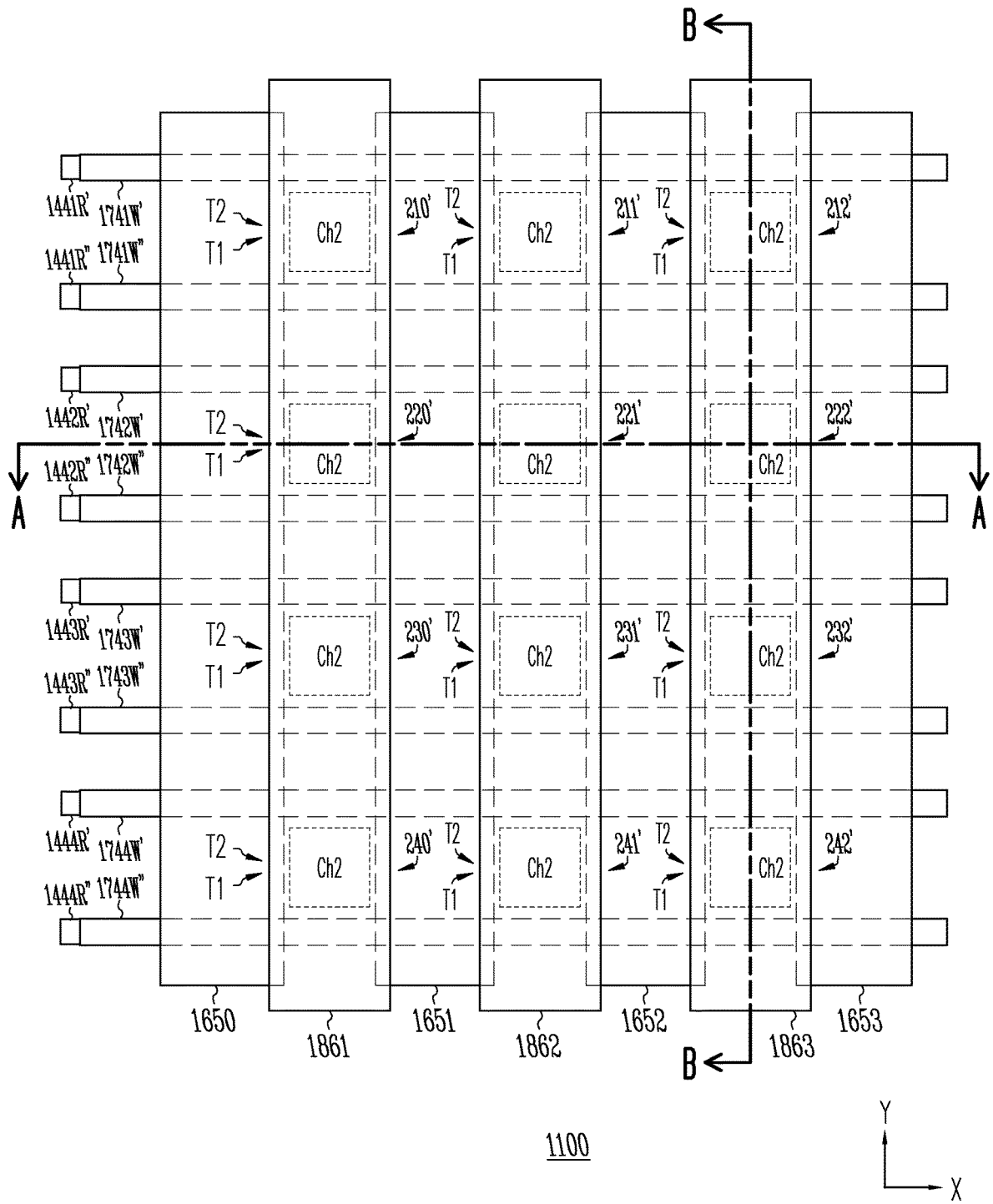
FIG. 11 shows a top view of a structure of a memory device, according to some embodiments described herein.

FIG. 11 shows a top view of structure of a memory device 1100, according to some embodiments described herein. For simplicity, FIG. 11 omits some of the elements (e.g., materials) that form part of memory device 1100. As shown in FIG. 11, the elements of memory device 1100 can be located relative to the X-direction and the Y-direction (e.g., X-Y plan). Line A-A and line B-B indicate cross-sectional lines showing locations of some of the elements of memory device 1100 relative to the X-direction and Y-direction, respectively, during the processes (described below) of forming memory device 1100.

Memory device 1100 can include memory cells 210', 211', and 212' (which can represent memory cells 210, 211, and 212, respectively of memory device 200 of FIG. 2); memory cells 220', 221', and 222' (which can represent memory cells 220, 221, and 222, respectively of memory device 200 of FIG. 2); memory cells 230', 231', and 232' (which can represent to memory cells 230, 231, and 232, respectively of memory device 200 of FIG. 2); and memory cells 240', 241', and 242'. As shown in FIG. 11, each of the memory cells of memory device 1100 can include transistors T1 and T2, which can represent transistors T1 and T2 of each of the memory cells of the memory devices shown in FIG. 2 through FIG. 8. As shown in FIG. 11, transistor T2 of each of the memory cells of memory device 1100 can include a channel region Ch2 (e.g., write channel). Transistors T1 and T2 of each of the memory cells of memory device 1100 can be located at the location of channel region Ch2 of transistor T2 of a respective memory cell.

As shown in FIG. 11, memory device 1100 can include data lines (e.g., read data lines) 1650, 1651, 1652, and 1653, and data lines (e.g., write data lines) 1861, 1862, and 1863. Each of data lines 1650, 1651, 1652, 1653, 1861, 1862, and 1863 can have length extending in the Y-direction.

Memory device 1100 can include conductive lines 1741W', 1741W'', 1742W', 1742W'', 1743W', 1743W'', 1744W', and 1744W'', which can be part of access lines (e.g., write word lines) of memory device 1100. Each of conductive lines 1741W', 1741W'', 1742W', 1742W'', 1743W', 1743W'', 1744W', and 1744W'' can have length extending in the X-direction.

Memory device 1100 can include conductive lines 1441R', 1441R'', 1442R', 1442R'', 1443R', 1443R'', 1444R', and 1444R'' that can be located (e.g., formed) below (e.g., as viewed from a top view shown FIG. 11) respective conductive lines 1741W', 1741W'', 1742W', 1742W'', 1743W', 1743W'', 1744W', and 1744W''. Conductive lines 1441R', 1441R'', 1442R', 1442R'', 1443R', 1443R'', 1444R', and 1444R'' can be part of other access lines (e.g., read word lines) of memory device 1100. Each of conductive lines 1441R', 1441R'', 1442R', 1442R'', 1443R', 1443R'', 1444R', and 1444R'' can have length extending in the X-direction.

Figure 12A:
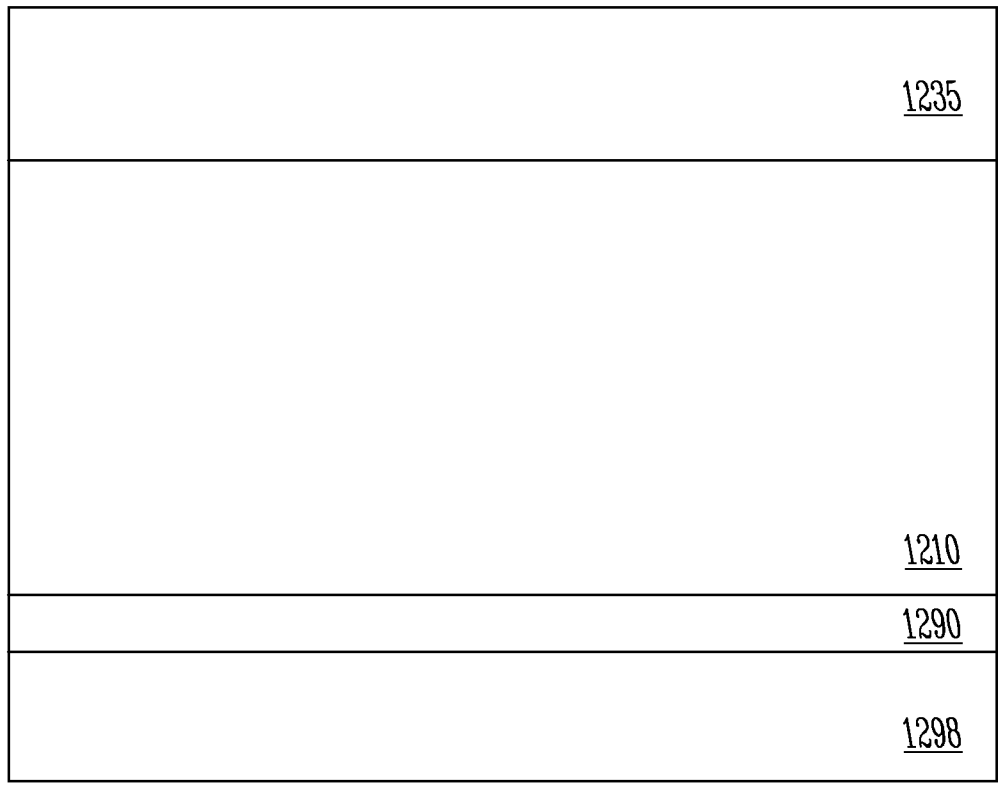
FIG. 12A through FIG. 18B show processes of forming the memory device of FIG. 11, according to some embodiments described herein.
Figure 12B:
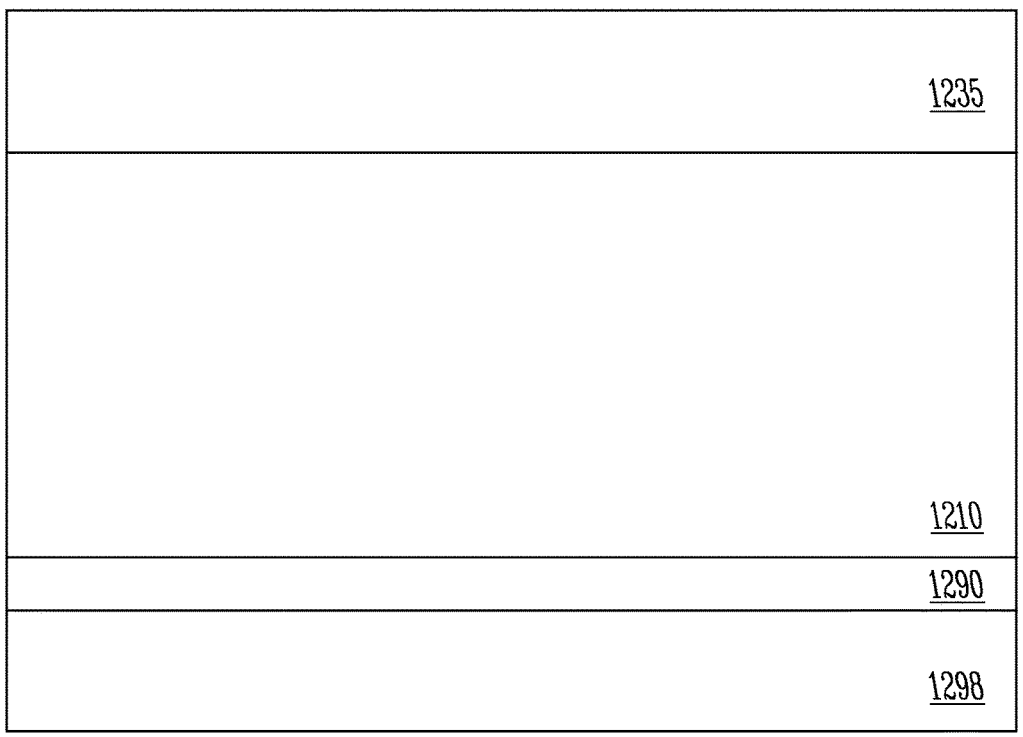

FIG. 12A through FIG. 18B show processes of forming memory device 1100 of FIG. 12, according to some embodiments described herein. Some or all of the processes used to form memory device 1100 can be used to form memory device 200, 600, 700, or 800 described above with reference to FIG. 2 through FIG. 10. In the following description, the figures labeled with "A" next to the figure number (e.g., FIG. 12A, FIG. 13A, FIG. 14A, FIG. 15A, FIG. 16A, FIG. 17A, and FIG. 18A) are views (e.g., cross-sectional views) of memory device 1100 (FIG. 11) along line A-A of FIG. 11. The figures labeled with "B" next to the figure number (e.g., FIG. 12B, FIG. 13B, FIG. 14B, FIG. 15B, FIG. 16B, FIG. 17B, and FIG. 18B) are views (e.g., cross-sectional views) of memory device 1100 (FIG. 11) along line B-B of FIG. 11.

FIG. 12A and FIG. 12B show memory device 1100 after a dielectric material 1290, a semiconductor material 1210, and a dielectric material 1235 are formed in respective levels (e.g., layers) in the Z-direction over a substrate 1298. The Z-direction (e.g., vertical direction) is a direction perpendicular to (e.g., outward from) substrate 1298. The Z-direction is also perpendicular to the X-direction and the Y-direction. Substrate 1298 can be a semiconductor substrate (e.g., silicon-based substrate) or other types of substrates. Semiconductor material 1210 can include silicon, polysilicon (e.g., doped or undoped polysilicon), or other semiconductor material (or materials). Dielectric material 1290, semiconductor material 1210, and dielectric material 1235 can be formed in a sequential fashion one material (e.g., one layer of material) after another over substrate 1298 in different levels of memory device 1100. For example, the processes used in FIG. 12 can include forming (e.g., depositing) dielectric material (e.g., silicon dioxide, SiO$_2$) 1290 over substrate 1298, forming (e.g., depositing) semiconductor material (e.g., silicon) 1210 over dielectric material 1290, and forming (e.g., depositing) dielectric material 1235 (e.g., silicon nitride, SiN$_4$) over semiconductor material 1210. In an alternative structure of memory device 1100, dielectric material 1290, substrate 1298, or both can be omitted, such that semiconductor material 1210 is the substrate of memory device 1100.

Figure 13A:
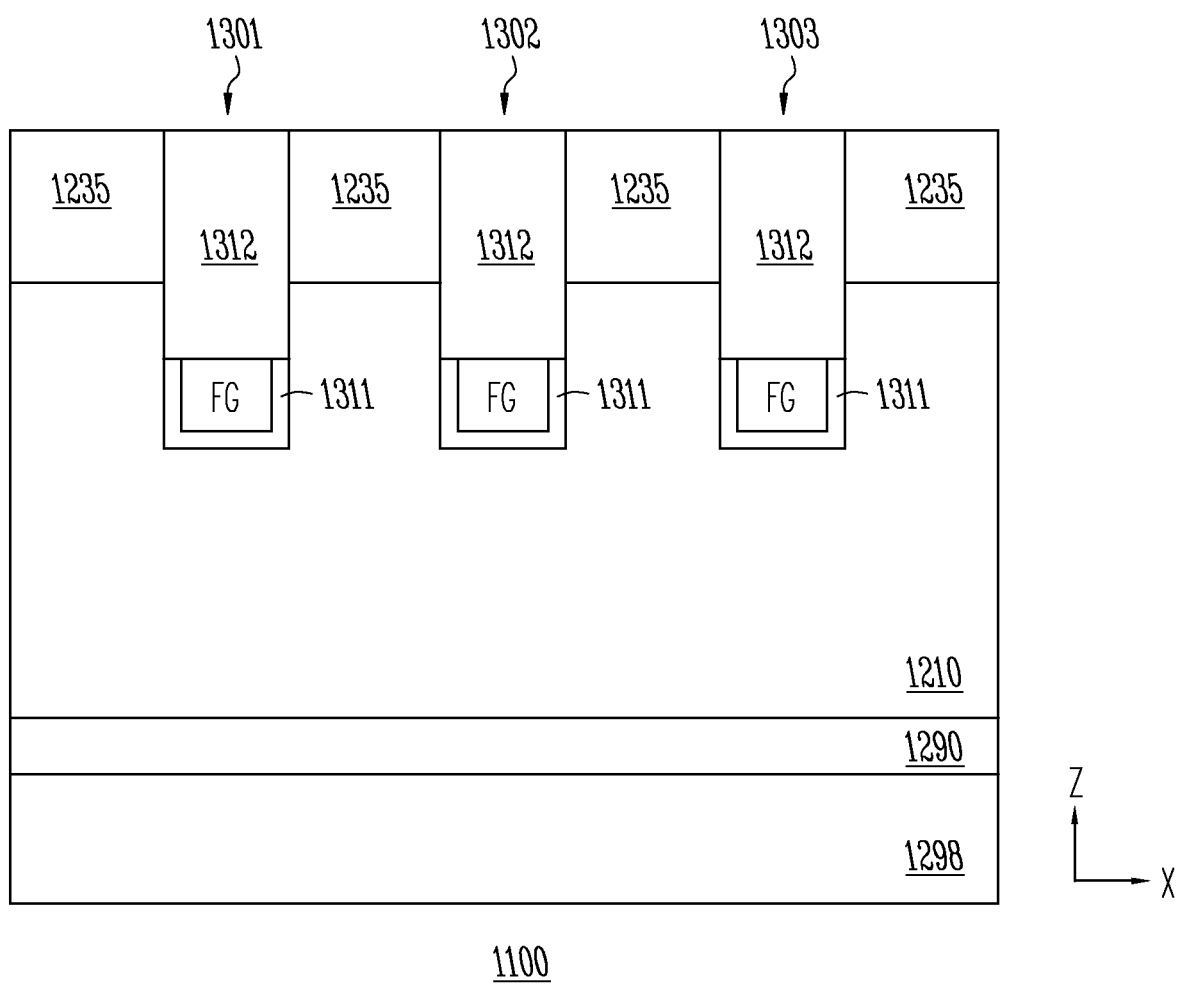
Figure 13B:
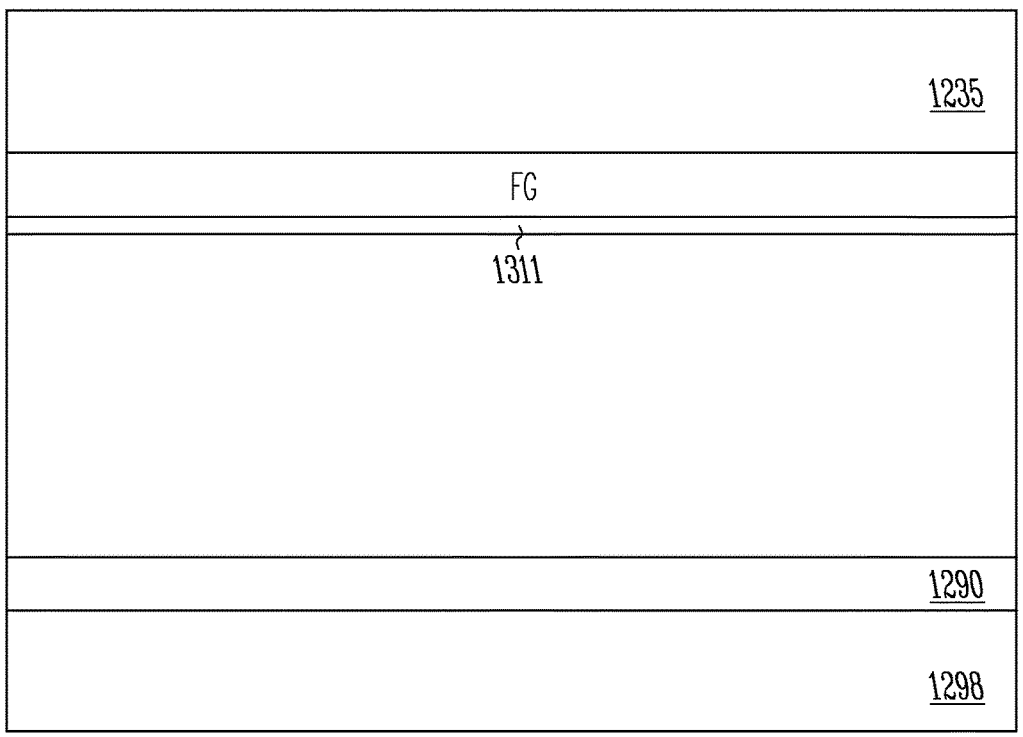

FIG. 13A and FIG. 13B show memory device 1100 after trenches 1301, 1302, and 1303 are formed, then other elements including charge storage structure FG, dielectric material 1311, and dielectric material 1312 are formed in trenches 1301, 1302, and 1303. Each of dielectric materials 1311 and 1312 can include an oxide of silicon (e.g., silicon dioxide). The material of charge storage structure FG can include a structure of semiconductor material, which can include a piece (e.g., a layer) of semiconductor material (e.g., polysilicon) or a piece (e.g., a layer) of metal.

Forming trenches 1301, 1302, and 1303 can include removing a portion of dielectric material 1235 and a portion of semiconductor material 1210 at the locations of trenches 1301, 1302, and 1303. Each of trenches 1301, 1302, and 1303 can have a length in the Y-direction, a width (shorter than the length) in the X-direction, and a bottom (not labeled) resting on a respective portion of semiconductor material 1210. Dielectric material 1311, charge storage structure FG, and dielectric material 1312 can be formed in a sequential order that can include forming dielectric material 1311, forming charge storage structure FG, and then forming dielectric material 1312.

Figure 14A:
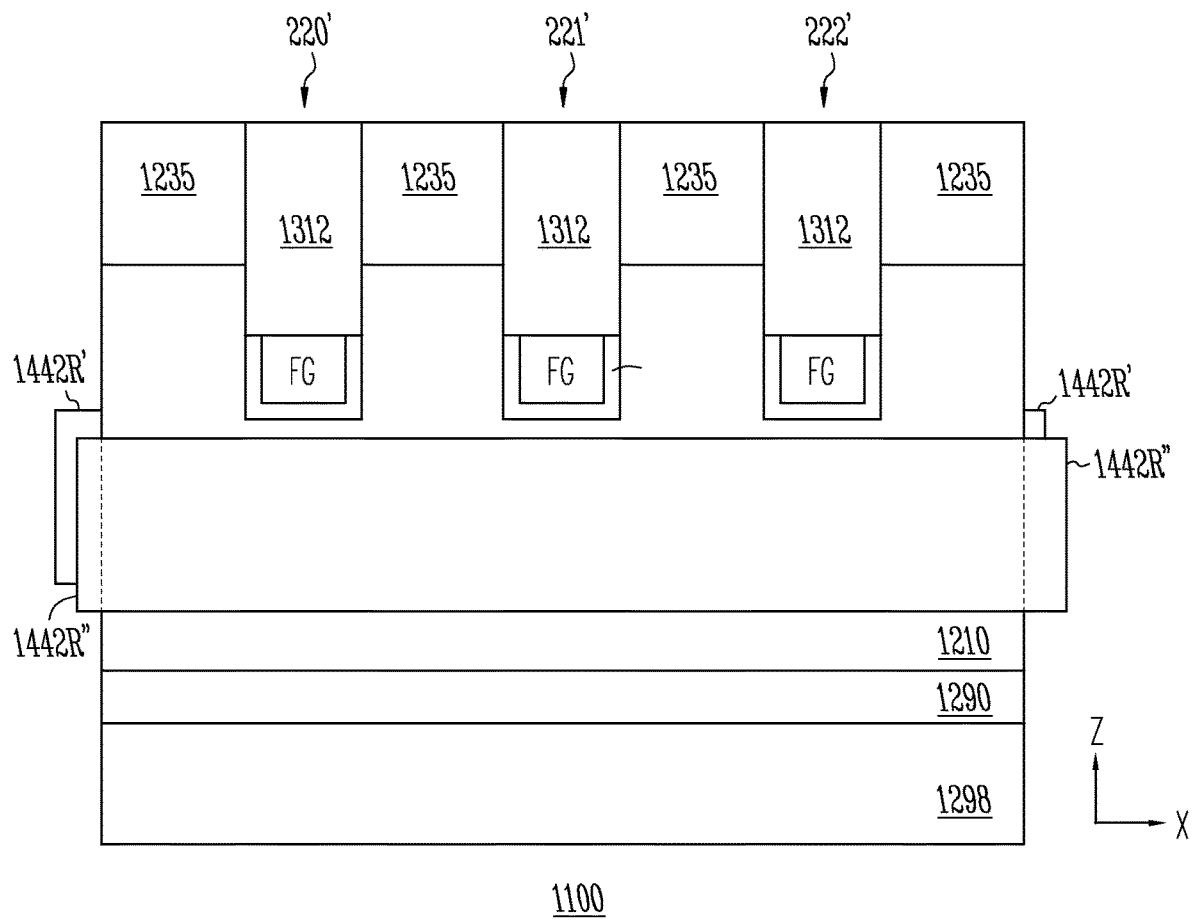
Figure 14B:
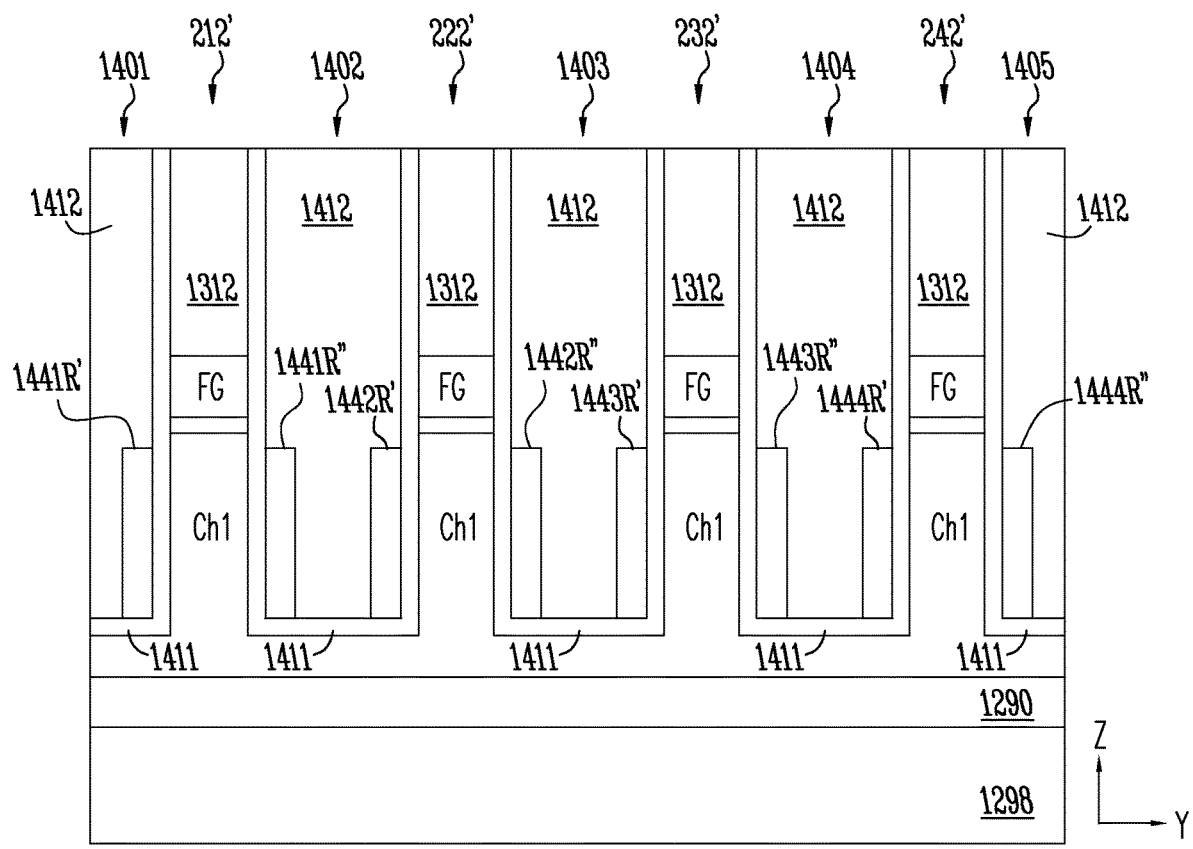

FIG. 14A and FIG. 14B shows memory device 1100 after trenches 1401, 1402, 1403, 1404, and 1405 are formed, and then dielectric materials (e.g., gate oxides) 1411, conductive lines (e.g., conductive regions) 1441R', 1441R", 1442R', 1442R", 1443R', 1443R", 1444R', and 1444R" (collectively referred to as conductive lines 1441R-1444R), and dielectric material 1412 are formed in respective trenches 1401, 1402, 1403, 1404, and 1405. Dielectric material 1411 can include silicon dioxide or other dielectric materials. Dielectric material 1412 can include silicon nitride or other dielectric materials. Each of conductive lines 1441R-1444R can include metal, conductively doped polysilicon, or other conductive materials.

Forming trenches 1401, 1402, 1403, 1404, and 1405 can include removing a portion of dielectric material 1235, a portion of semiconductor material 1210, a portion of dielectric material 1311, a portion of dielectric material 1312, and a portion of charge storage structure FG at the locations of trenches 1401, 1402, and 1403. Each of trenches 1401, 1402, 1403, 1404, and 1405 can have a length in the X-direction, a width (shorter than the length) in the Y-direction, and a bottom (not labeled) resting on a respective portion of semiconductor material 1210. As shown in FIG. 14A and FIG. 14B, the bottom of each of trenches 1401, 1402, 1403, 1404, and 1405 can be below (e.g., deeper than) the bottom of each of trenches 1301, 1302, and 1303, and 1304, in the Z-direction with respect to the location of charge storage structure FG. Thus, conductive lines 1441R-1444R can be formed below charge storage structure FG of each of the memory cells of memory device 1100. This can improve the operation (e.g., allow using a lower operating bias voltage on the access lines) of memory device 1100.

Each of conductive lines 1441R-1444R can have a length extending in the X-direction, a width extending the Z-direction, and a thickness extending in the Y-direction. For example, as shown in FIG. 14A, each of conductive lines 1441R (which is formed in trench 1401) and conductive line 1441R" (which is formed in trench 1402) can have a length extending in the X-direction, a width (e.g., less than the length) extending the Z-direction, and a thickness (e.g., less than the width) extending in the Y-direction.

As shown in FIG. 14A, a portion of memory device 1100 can form part of memory cells 220', 221', and 222' (in the X-direction). As shown in FIG. 14B, a portion of memory device 1100 can form part of memory cells 212', 222', 232', and 242' (in the Y-direction). A portion of semiconductor material 1210 can form channel region Ch1 of transistor T1 ("T1" is not labeled) of a respective memory cell (e.g., memory cells 212', 222', 232', or 242'). Each of charge storage structure FG can form a memory element of a respective memory of the memory cells shown in FIGS. 14A and 14B. Memory cells 220', 221', 212', 222', and 232' in FIG. 14A and FIG. 14B can represent memory cell 220, 221, 212, 222, and 232, respectively, of FIG. 2.

Conductive lines 1441R-1444R in FIG. 14A and FIG. 14B can form part of access lines (e.g., read word lines) of memory device 1100. Conductive lines 1441R-1444R can include pairs of conductive lines that can be electrically coupled together (e.g., shorted to each) by a conductive connection. For example, the processes of forming memory device 1100 can include forming a conductive connection, not shown, which can include a conductive material (e.g., metal) to electrically couple conductive lines (a pair of conductive lines) 1442R' and 1442R" to each other. Similarly, the processes of forming memory device 1100 can include forming a conductive connection, not shown, which can include a conductive material (e.g., metal) to electrically couple conductive lines 1441R' and 1441R" (FIG. 14B) to each other, forming a conductive connection (not shown) to electrically couple conductive lines 1443R' and 1443R" (FIG. 14B) to each other, and forming a conductive connection (not shown) to electrically couple conductive lines 1444R' and 1444R" (FIG. 14B) to each other.

As shown in FIG. 14A and FIG. 14B, each pair of conductive lines among conductive lines 1441R-1444R can be located on opposite sides (with respect to the Y-direction) of channel region Ch1 of a respective memory cell. Each pair of conductive lines among conductive lines 1441R-1444R can form a double gate (e.g., read word lines) and can be located (e.g., can be formed) below a respective charge storage structure FG of a respective memory cell. For example, conductive lines 1441R and 1441R" can form a double gate (e.g., read word lines) that is located below charge storage structure FG of memory cell 212'.

Some of conductive lines 1441R-1444R can form part of access lines that can represent some of the access lines of memory device 200 of FIG. 2. For example, conductive lines 1441R and 1441R" can be electrically coupled together (e.g., coupled together by a conductive connection, not shown, which can represent access line 241R of FIG. 2). Conductive lines 1442R' and 1442R" can be electrically coupled together (e.g., coupled together by a conductive connection, not shown, which can represent access line 242R of FIG. 2). Conductive lines 1443R' and 1443R" can be electrically coupled together (e.g., coupled together by a conductive connection, not shown, which can represent access line 243R of FIG. 2.

Figure 15A:
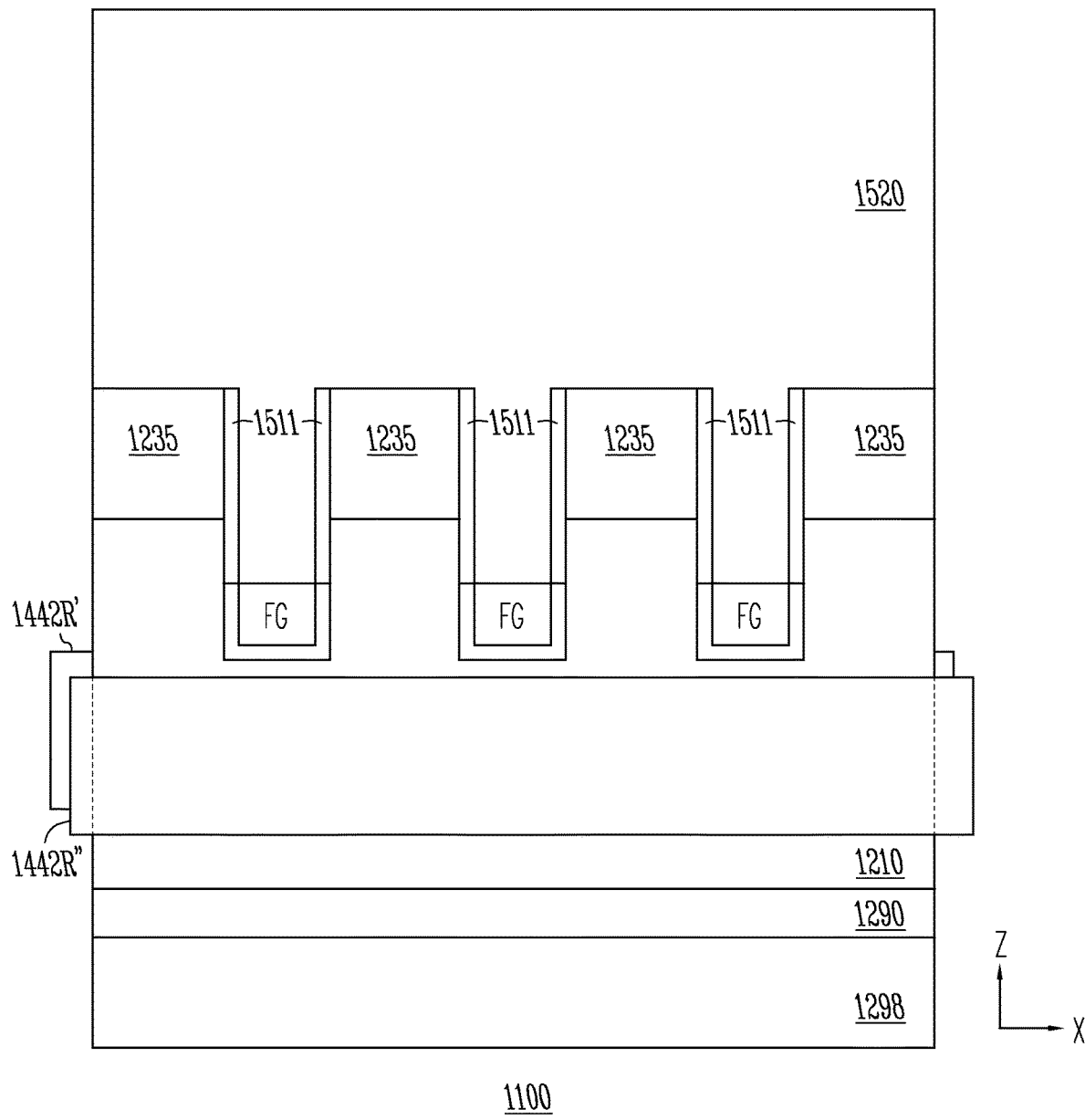
Figure 15B:
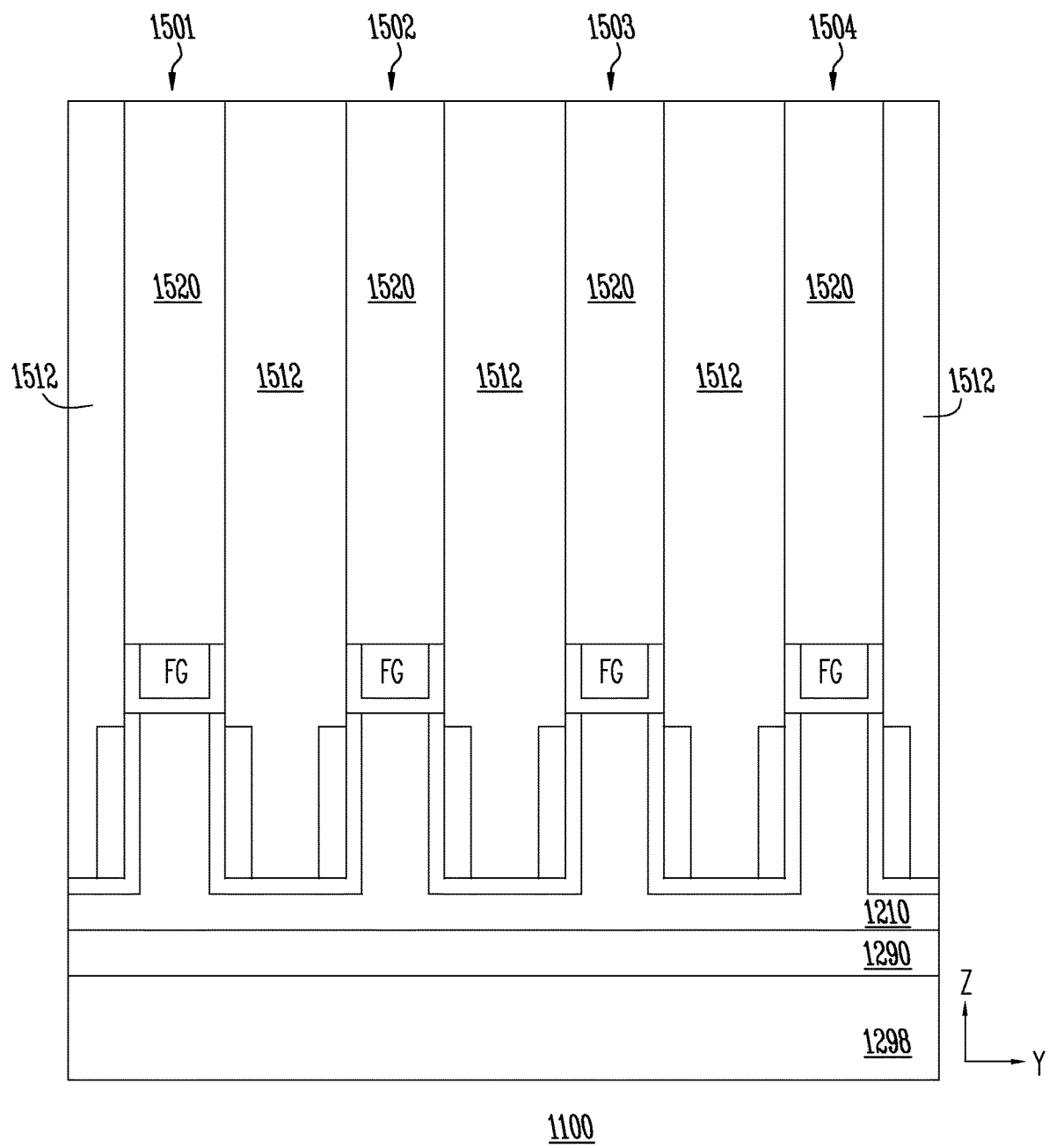

FIG. 15A and FIG. 15B show memory device 1100 after a dielectric material 1511 (FIG. 15A), a dielectric material 1512 (FIG. 15B), and a material (or materials) 1520 are formed. Forming dielectric material 1511 can include removing dielectric material 1312 (FIG. 14A) to expose (e.g., expose top surface of) charge storage structure FG, then dielectric material 1511 can be formed (as shown in FIG. 15A) in a portion of the spaces where dielectric material 1312 was removed. Dielectric material 1512 can be formed by depositing an initial dielectric material and moving (e.g., by etching) a portion of the initial dielectric material at trenches 1501, 1502, 1503, and 1504. The remaining portion (which is outside trenches 1501, 1502, 1503, and 1504) of the initial dielectric material forms dielectric material 1512.

Material 1520 can be formed (e.g., deposited) by depositing a material or materials (examples of material 1520 are described below) in trenches 1501, 1502, 1503, and 1504. As shown in FIGS. 15A and 15B, material 1520 can be formed (e.g., deposited) directly over each charge storage structure FG, such that material 1520 can be electrically coupled to (e.g., directly coupled to) each charge storage structure FG.

Material 1520 can be subsequently processed to form a channel region (e.g., a write channel region) of a transistor (e.g., transistor T2) of a respective memory cell among the memory cells (e.g., memory cell 212', 222', 232', and 242') of memory device 1100. For example, material 1520 can be subsequent processed to form a channel region that can represent channel region Ch2 of transistor T2 of a respective memory cell among the memory cells of memory device 1100 of FIG. 2.

Material 1520 of FIG. 15A can include semiconducting material. The semiconducting material can include an oxide material. Examples of the oxide material include semiconducting oxide materials, transparent conductive oxide materials, and other oxide materials.

As an example, material 1520 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

The materials listed above are examples of materials 1520. However, other materials (e.g., a relatively high band-gap material) different from the above-listed materials can be used.

Using the material listed above in memory device 1100 provides improvement and benefits for memory device 1100 over some other materials. For example, during a read operation to read information from a selected memory cell (e.g., memory cell 212', 222', 232', or 242') of memory device 1100, charge from charge storage structure FG of the selected memory cell may leak from the selected memory cell. Using the material listed above for the channel region of a transistor (e.g., transistor T2) of a respective memory cell can reduce or prevent such a leakage. This improves accuracy of information read from the selected memory cell and improves the retention of information stored in the memory cells of the memory device (e.g., memory device 1100) described herein.

Figure 16A:
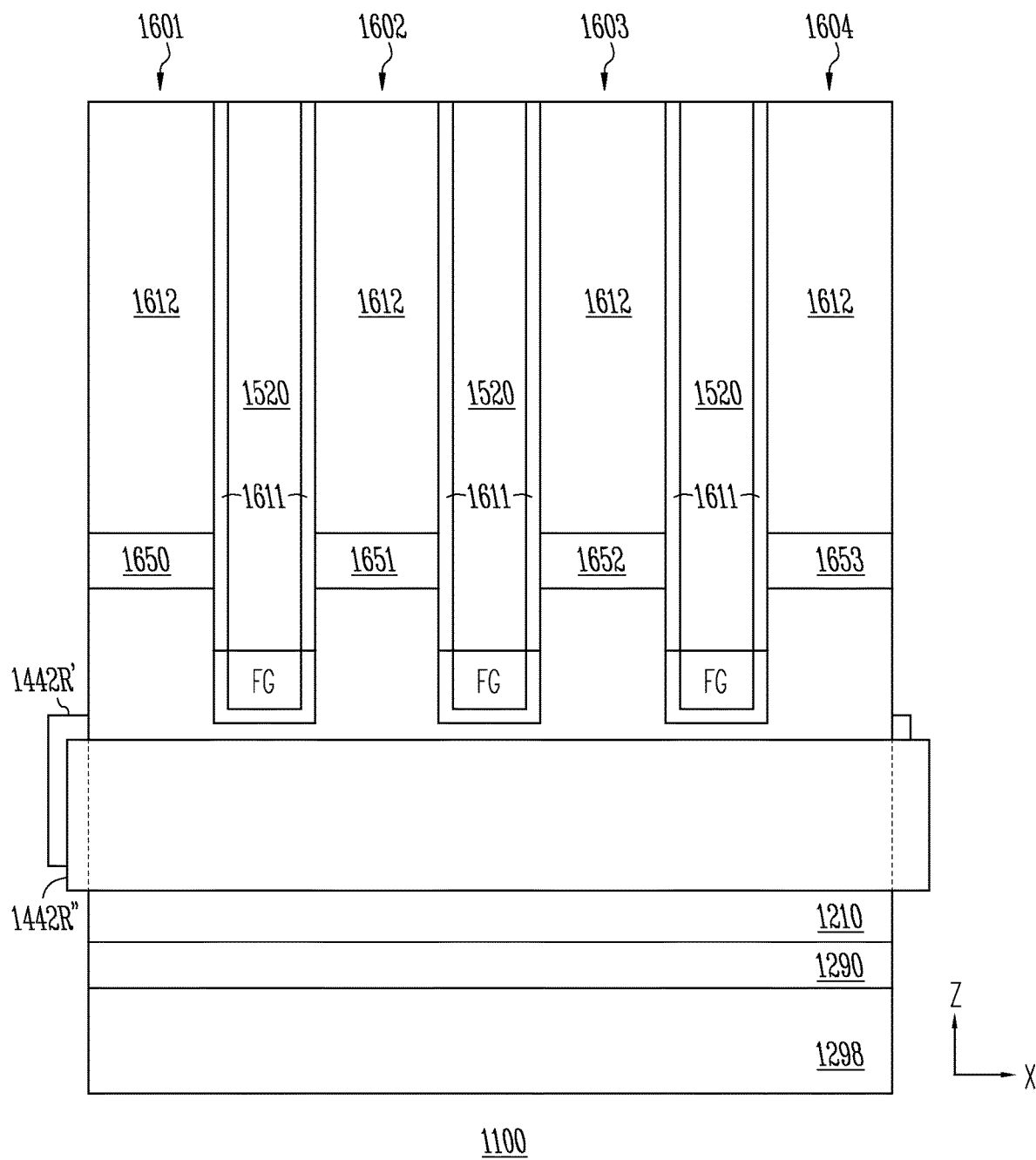
Figure 16B:
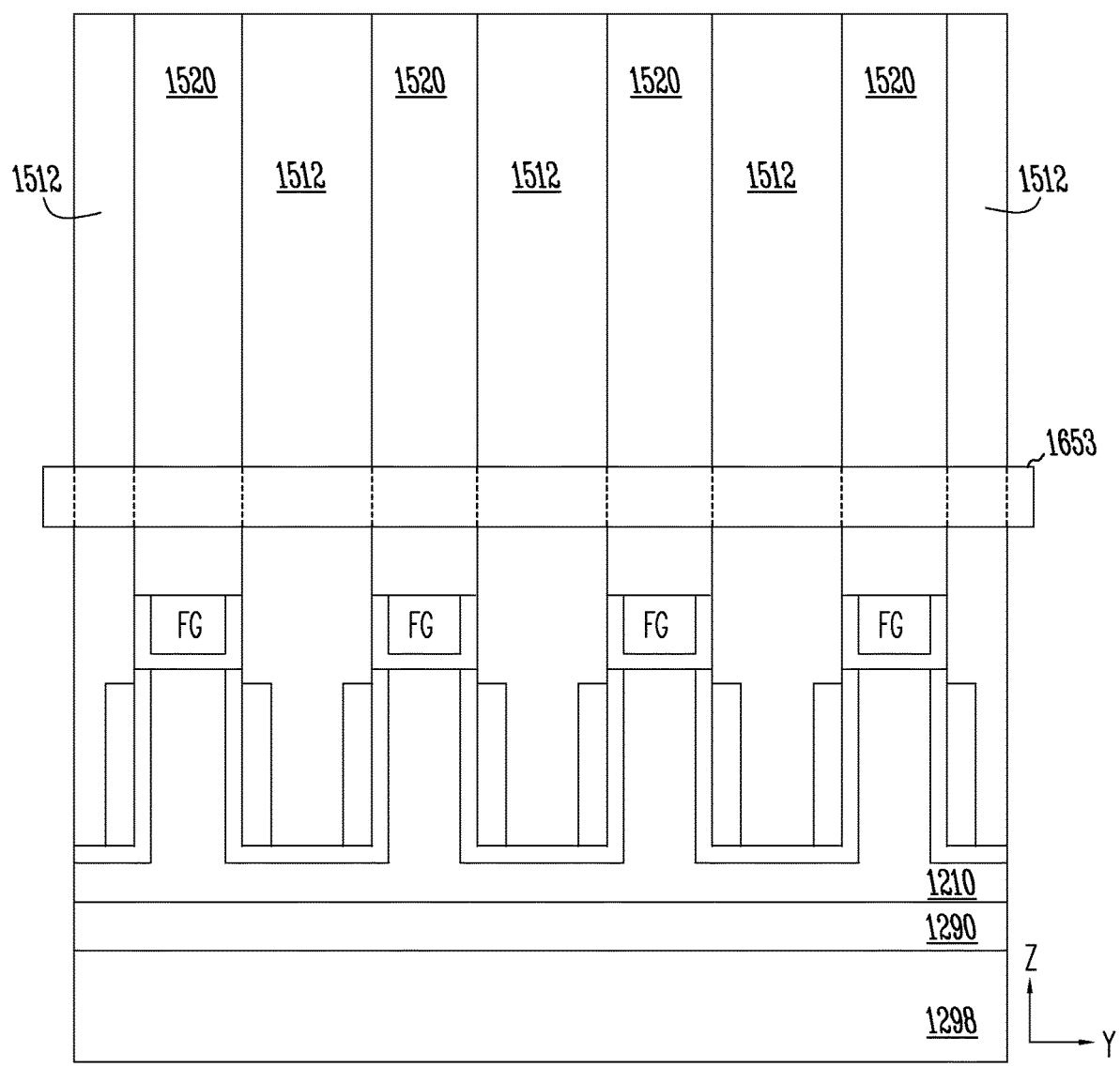

FIGS. 16A and 16B show memory device 1100 after trenches 1601, 1602, 1603, and 1604 are formed, then data lines (e.g., read data lines) 1650, 1651, 1652, and 1653, and dielectric materials 1611 and 1612 and a material (or materials) 1520 are formed in trenches 1601, 1602, 1603, and 1604. Dielectric material 1611 can include silicon dioxide or other dielectric materials. Dielectric material 1612 can include silicon nitride or other dielectric materials. Each of data lines 1650, 1651, 1652, and 1653 can include metal, conductively doped polysilicon, or other conductive materials.

Forming trenches 1601, 1602, 1603, and 1604 can include removing a portion of material 1520, a portion of dielectric material 1511, and dielectric material 1235 to expose semiconductor material 1210 at the locations of trenches 1601, 1602, 1603, and 1604. Each of trenches 1601, 1602, 1603, and 1604 can have a length in the Y-direction, a width (shorter than the length) in the X-direction, and a bottom (not labeled) resting on a respective portion of material semiconductor material 1210.

Dielectric material 1611, data lines 1650, 1651, 1652, and 1653, and dielectric material 1612 can be formed in a sequential order that can include forming dielectric material 1611, forming data lines 1650, 1651, 1652, and 1653 after dielectric material 1611 is formed, and then forming dielectric material 1612. As shown in FIGS. 16A and 16B, data lines 1650, 1651, 1652, and 1653 can be formed (e.g., deposited) directly over semiconductor material 1210 (e.g., formed on the bottoms of respective trenches 1601, 1602, 1603, and 1604), such that data lines 1650, 1651, 1652, and 1653 can be electrically coupled to (e.g., directly coupled to) semiconductor material 1210.

Figure 17A:
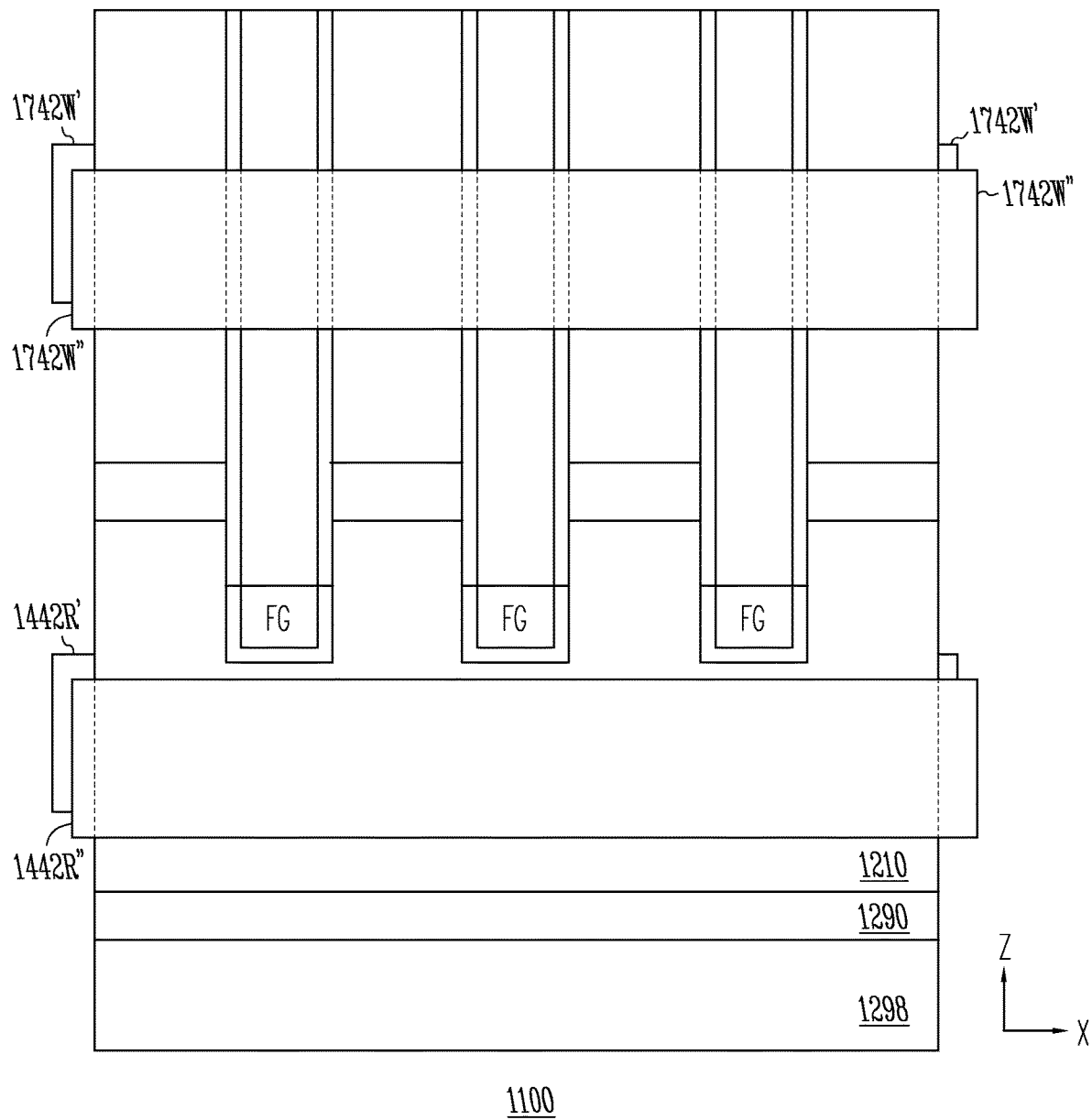
Figure 17B:
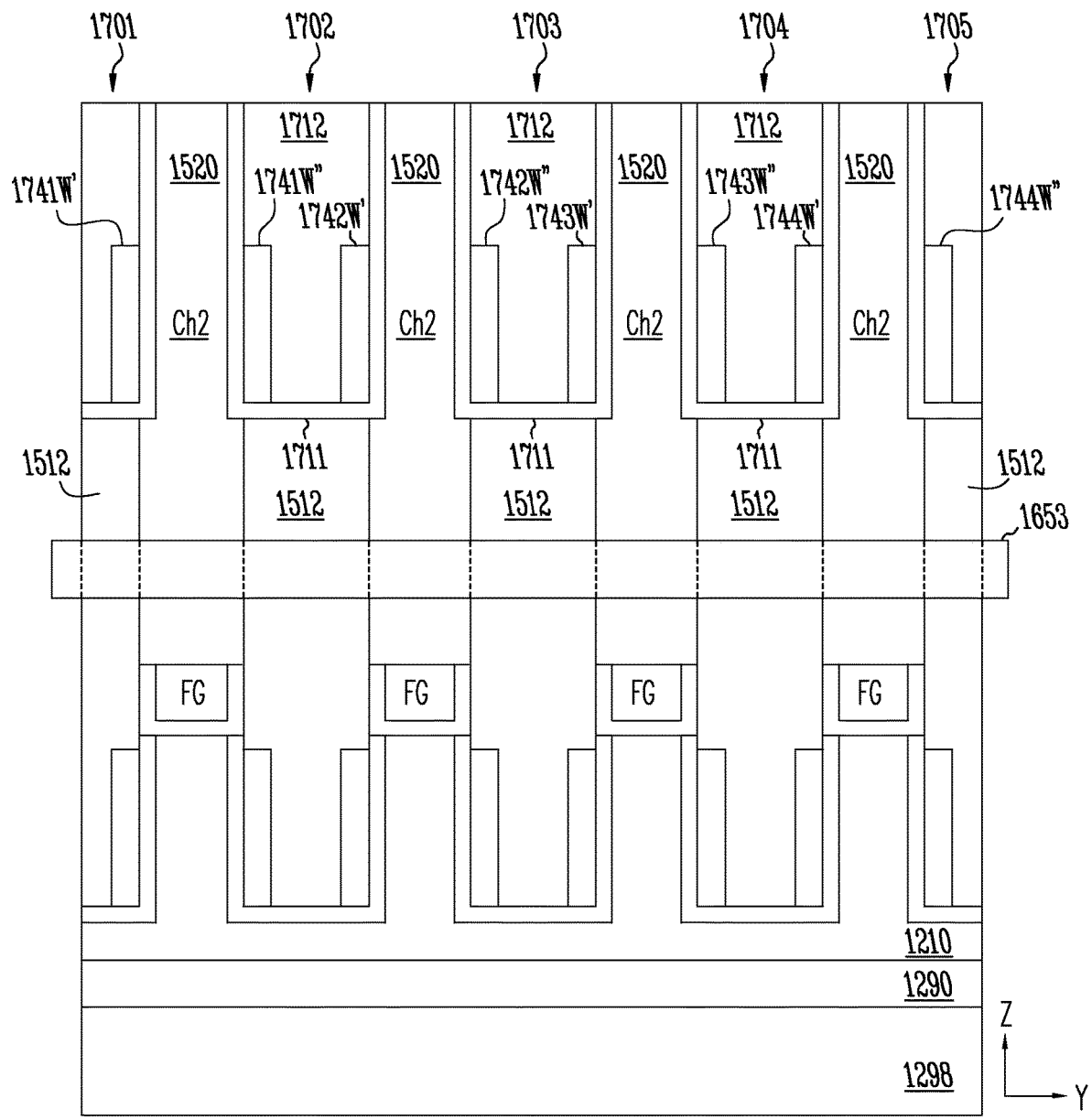

FIG. 17A and FIG. 17B shows memory device 1100 after trenches 1701, 1702, 1703, 1704, and 1705 are formed, and then dielectric materials (e.g., gate oxides) 1711, conductive lines (e.g., conductive regions) 1741W', 1741W'', 1742W', 1742W'', 1743W', 1743W'', 1744W', and 1744W'' (collectively referred to as 1741W-1744W), and dielectric material 1712 are formed in respective trenches 1701, 1702, 1703, 1704, and 1705. Dielectric material 1711 can include silicon dioxide or other dielectric materials. Dielectric material 1712 can include silicon nitride or other dielectric materials. Each of conductive lines 1741W-1744W can include metal, conductively doped polysilicon, or other conductive materials.

Forming trenches 1701, 1702, 1703, 1704, and 1705 can include removing a portion of dielectric material 1512 and a portion of material 1520 at the locations of trenches 1701, 1702, 1703, 1704, and 1705. Each of trenches 1701, 1702, 1703, 1704, and 1705 can have a length in the X-direction, a width (shorter than the length) in the Y-direction, and a bottom (not labeled) resting on a respective portion of dielectric material 1612.

Each of conductive lines 1741W-1744W can have a length extending in the X-direction, a width extending the Z-direction, and a thickness extending in the Y-direction. For example, as shown in FIG. 17A, each of conductive line 1741W' (which is formed in trench 1701) and conductive line 1741W'' (which is formed in trench 1702) can have a length extending in the X-direction, a width (e.g., less than the length) extending the Z-direction, and a thickness (e.g., less than the width) extending in the Y-direction.

Conductive lines 1741W-1744W can form part of access lines (e.g., write word lines) of memory device 1100. Conductive lines 1741W-1744W can include pairs of conductive lines that can be electrically coupled together (e.g., shorted to each other) by a conductive connection. For example, the processes of forming memory device 1100 can include forming a conductive connection 1742' (which can include a conductive material (e.g., metal)) to electrically couple conductive lines (a pair of conductive lines) 1742W' and 1742W'' to each other. Similarly, the processes of forming memory device 1100 can include forming a conductive connection (not shown) to electrically couple conductive lines 1741W' and 1741W'' (FIG. 17B) to each other, forming a conductive connection (not shown) to electrically couple conductive lines 1743W' and 1743W'' (FIG. 17B) to each other, and forming a conductive connection (not shown) to electrically couple conductive lines 1744W' and 1744W'' (FIG. 17B) to each other.

As shown in FIG. 17A and FIG. 17B, each pair of conductive lines among conductive lines 1741W-1744W can be located on opposite sides (with respect to the Y-direction) of channel region Ch2 of a respective memory cell. Each pair of conductive lines among conductive lines 1741W-1744W can form a double gate (e.g., write word lines) and can be located (e.g., can be formed) above a respective charge storage structure FG of a respective memory cell.

Some of conductive lines 1741W-1744W can form part of access lines that can represent some of the access lines of memory device 200 of FIG. 2. For example, conductive lines 1741W' and 1741W'' can be electrically coupled together (e.g., coupled together by a conductive connection, not shown, which can represent access line 241W of FIG. 2). Conductive lines 1742W' and 1742W'' can be electrically coupled together (e.g., coupled together by a conductive connection, not shown, which can represent access line 242W of FIG. 2). Conductive lines 1743W' and 1743W" can be electrically coupled together (e.g., coupled together by a conductive connection, not shown, which can represent access line 243W of FIG. 2).

Figure 18A:
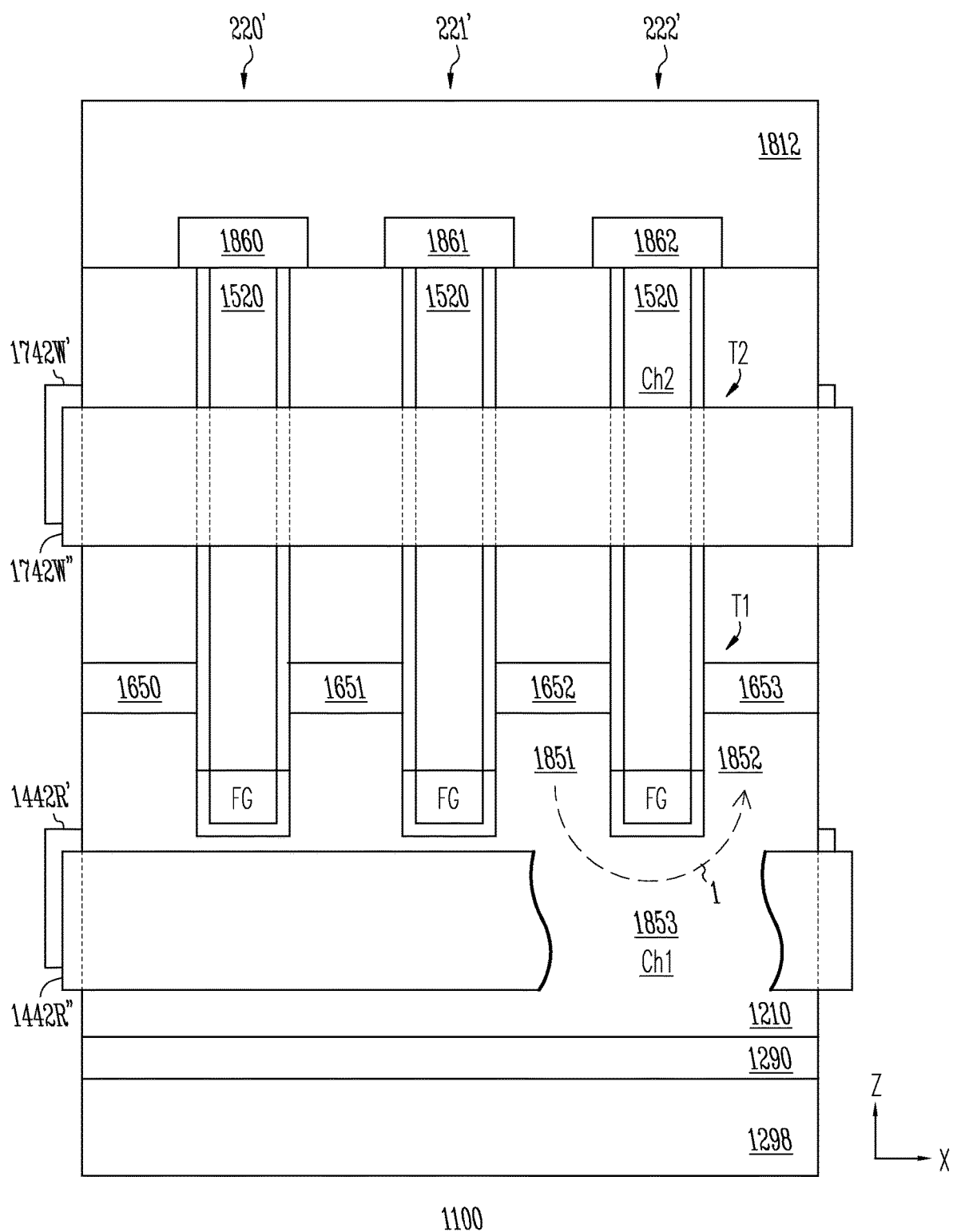
Figure 18B:
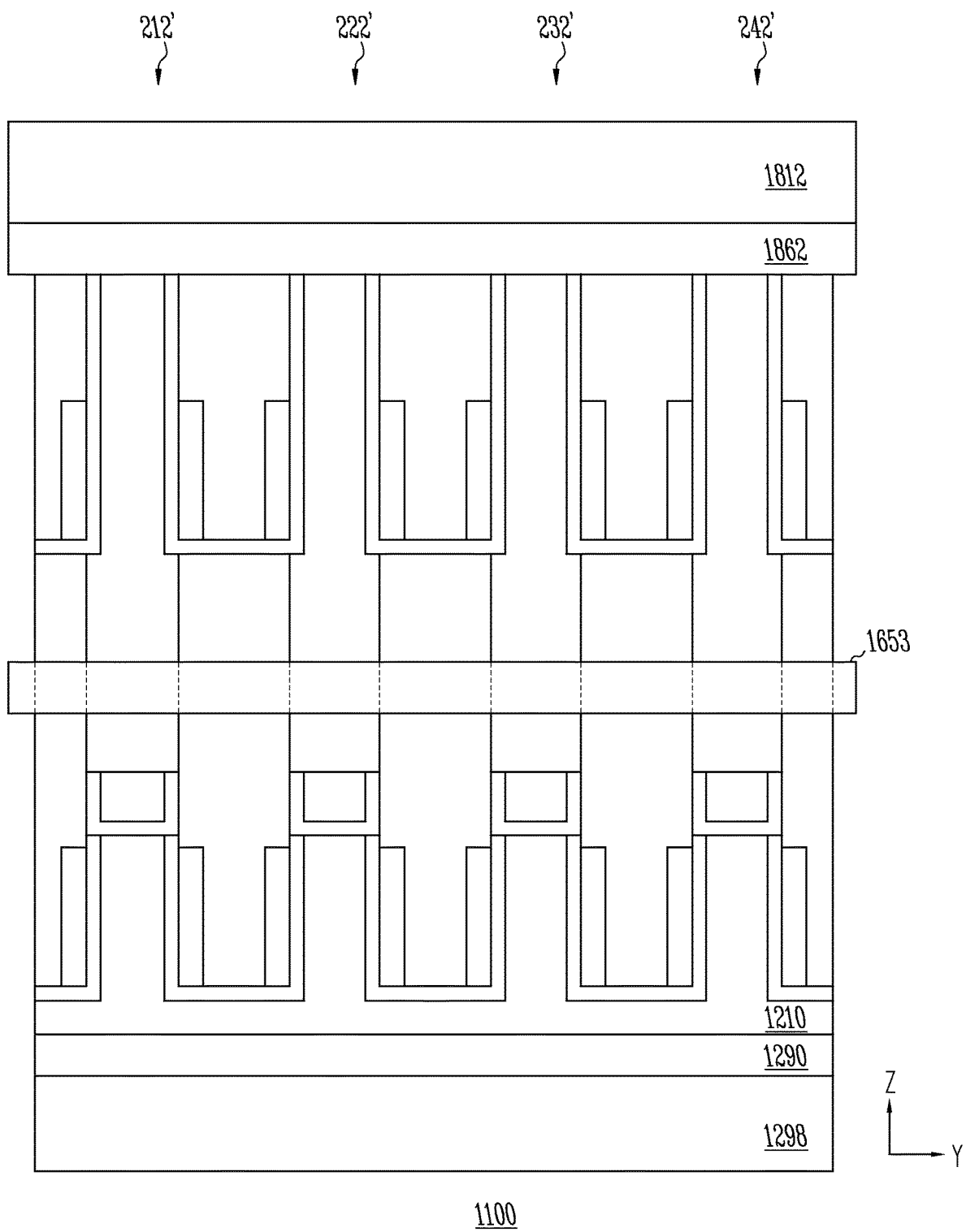

FIG. 18A and FIG. 18B show memory device 1100 after data lines (e.g., write data lines) 1860, 1861, and 1862, and dielectric material 1812 are formed. Each of data lines 1860, 1861, and 1862 can include metal, conductively doped polysilicon, or other conductive materials. Dielectric material 1812 can include silicon nitride or other dielectric materials.

As shown in FIG. 18A, each of materials 1520 can form a channel region Ch2 of a transistor T2 (which is located above transistor T1) of a respective memory cell. For simplicity, only transistors T1 and T2 of memory cell 222' are labeled in FIGS. 18A and 18B. Transistors T1 and T2 of other memory cells (e.g., memory cells 220' and 221') are not labeled. Transistors T1 and T2 of memory cell 222' can represent transistors T1 and T2, respectively, of memory cell 222 of memory device 200 of FIG. 2.

As shown in FIGS. 18A and 18B, each of data lines 1860, 1861, and 1862 can be electrically coupled to (e.g., directly coupled to) channel region Ch2 of transistor T2 of a respective memory cell in the X-direction and can be electrically coupled to (e.g., directly coupled to) channel region Ch2 of transistor T2 memory cells in the Y-direction.

As shown in FIG. 18A, portions 1851, 1852, and 1853, where portions 1851 and 1852 can be located on opposite sides of charge storage structure FG of memory cell 222' and portion 1853 can be located between portions 1851 and 1852. Portions 1851, 1852, and 1853 of semiconductor material 1210 can form a channel region (e.g., channel region Ch1), a source terminal, and a drain terminal, respectively, of transistor T1 of memory cell 222'. Thus, the source terminal, channel region Ch1, and the drain terminal of transistor T1 of memory cell 222' can be formed from a single structure (e.g., a single piece) of the same material (e.g., the same portion of material 1210). Transistor T1 of other memory cells of memory device 1100 has a similar structure as transistor T1 of memory cells 222'. Such a similar structure is not described herein for simplicity. In FIG. 18A, a current I can represent a current flowing through a path (e.g., a read path) that include data lines 1652 and 1653 during a read operation of memory device 1100. Such a read operation can include reading information from memory cell 222' (e.g., selected memory cell).

As shown in FIG. 18A, material 1520 directly coupled to data line 1862 can form channel region Ch2 of transistor T2 of memory cell 222', a source terminal (which is directly coupled to data line 1862) of transistor T2 of memory cell 222', and a drain terminal of transistor T2 (which is directly coupled to charge storage structure FG of memory cell 222'). Thus, the source terminal, the channel region, and the drain terminal transistor T2 of memory cell 222' can be formed from a single structure (e.g., a single piece) of the same material (e.g., material 1520, directly coupled to data line 1862). Transistor T2 of other memory cells of memory device 1100 has a similar structure as transistor T2 of memory cells 222'. Such a similar structure is not described herein for simplicity.

The description of forming memory device 1100 with reference to FIG. 11 through FIG. 18B can include other processes to form a complete memory device. Such processes are omitted from the above description so as to not obscure the subject matter described herein.

Figure 19A:
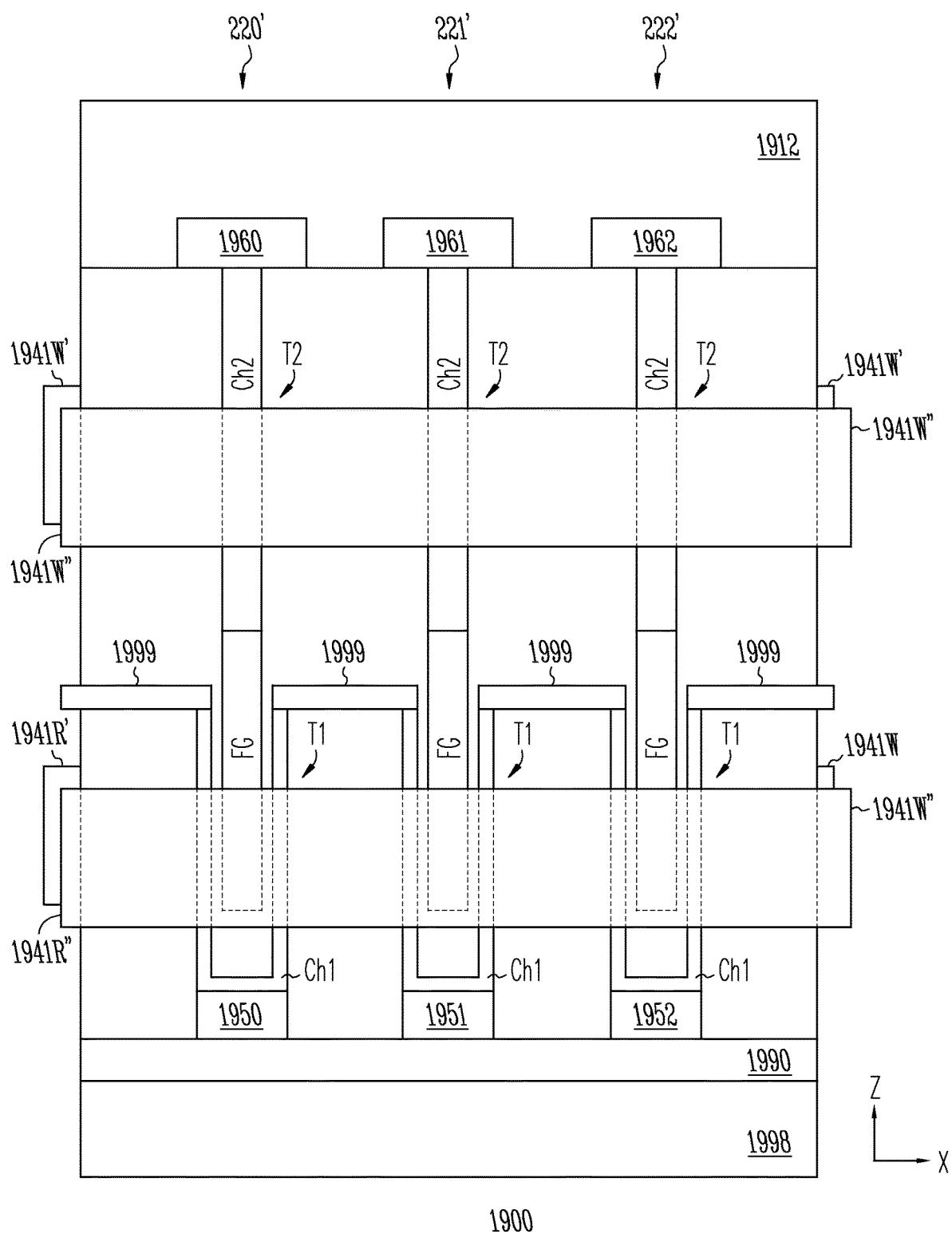
FIG. 19A and FIG. 19B show side views of a structure of a memory device including a ground connection coupled to each memory cell of the memory device, according to some embodiments described herein.
Figure 19B:
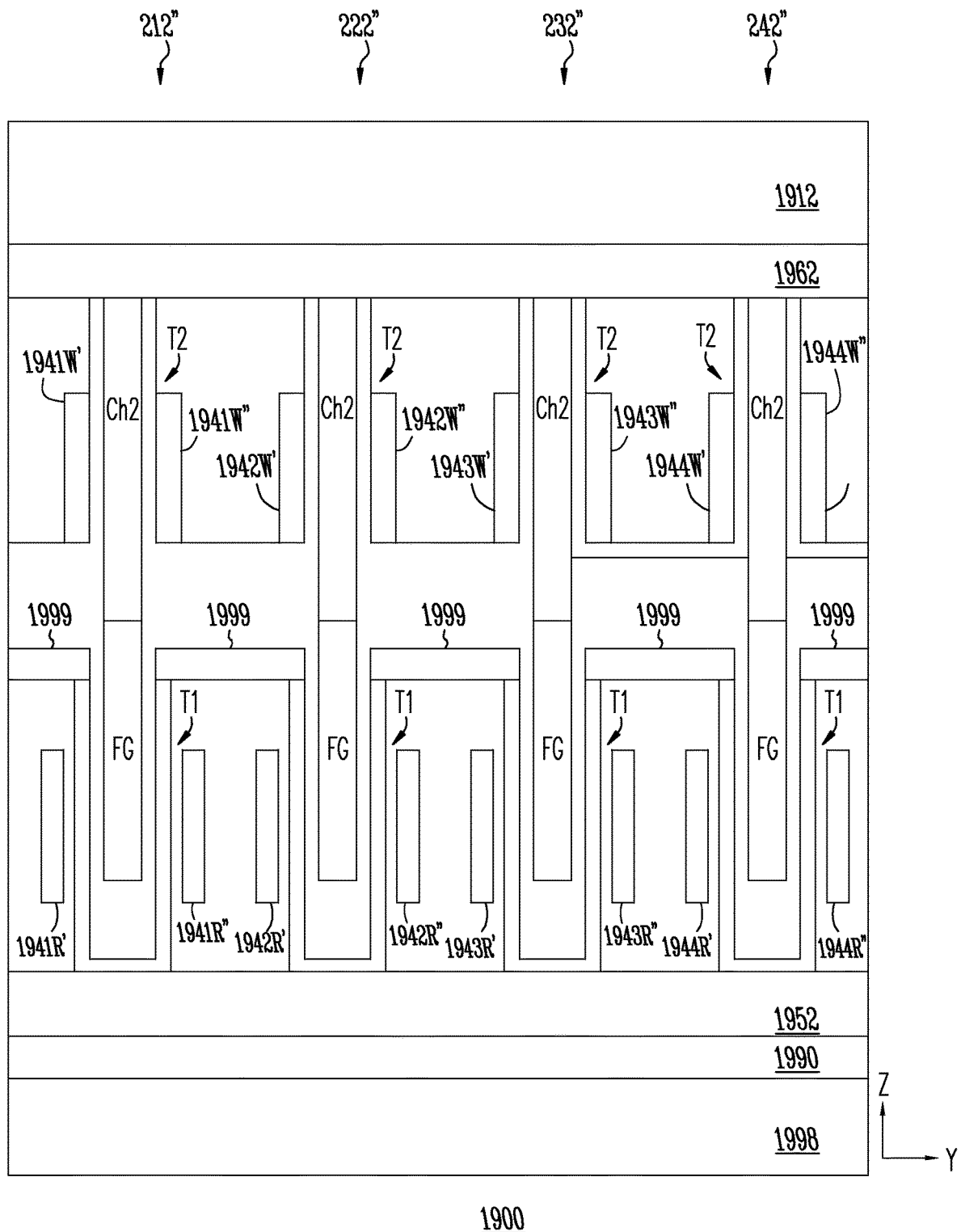

FIG. 19A and FIG. 19B show side views of a structure of a memory device 1900 including a ground connection 1999 coupled to each memory cell of memory device 1900, according to some embodiments described herein. Memory device 1900 can have a top view similar to the top view of memory device 1100 shown in FIG. 11 and can include elements similar to the elements of memory device 1100 (FIG. 11 through FIG. 18B). For example, FIG. 19A shows a side view of memory device 1900 in the X-Z directions similar to the side view of memory device 1100 of FIG. 18A. FIG. 19B shows a side view of memory device 1900 in the Y-Z directions similar to the side view of memory device 1100 of FIG. 18B.

As shown in FIG. 19A and FIG. 19B, memory device 1900 can include a substrate 1998 and a dielectric material 1990 that can be similar to substrate 1198 and 1190, respectively, of memory device 1100 (FIG. 11 through FIG. 18B. Memory device 1900 can include memory cells, such as memory cells 220", 221", and 222" in FIG. 19A and memory cells 212", 222", 232", and 242" in FIG. 19B (memory cell 222" can be seen in both FIG. 19A and FIG. 19B). Memory cells 220", 221", 222", 212", 232", and 242" can represent memory cells 220, 221, 222, 212, 232, and 242, respectively, of memory device 900 of FIG. 9.

As shown in FIG. 19A and FIG. 19B, each of the memory cells of memory device 1900 can include a 2T memory cell that has transistors T1 and T2 formed in the Z-direction (e.g., arranged vertically). Transistor T1 of each of the memory cells of memory device 1900 can include charge storage structure FG. Transistors T1 and T2 of each of the memory cells of memory device 1900 can include channel regions Ch1 and Ch2, respectively. In the same memory cell, channel region Ch2 can be electrically coupled to charge storage structure FG of that memory cell. The materials for channel regions Ch1 and Ch2 of memory device 1900 can be similar to or identical to the materials for channel regions Ch1 and Ch2, respectively, of the memory devices described above with reference to FIG. 2 through FIG. 18B.

As shown in FIG. 19A and FIG. 19B, a portion of channel region Ch1 (which can also be a source terminal of transistor T1) can be coupled to ground connection 1999. Ground connection 1999 can represent ground connection 999 of memory device 900 of FIG. 9.

Memory device 1900 can include access lines (e.g., read word lines) formed by conductive lines 1941R', 1941R", 1942R', 1942R", 1943R', 1943R", 1944R', and 1944R", where each pair (e.g., pair of conductive lines 1941R' and 1941R") of these conductive lines can be electrically coupled to each other. Memory device 1900 can include access lines (e.g., write word lines) formed by conductive lines 1941W', 1941W", 1942W', 1942W", 1943W', 1943W", 1944W', and 1944W", where each pair (e.g., pair of conductive lines 1941W' and 1941W") of these conductive lines can be electrically coupled to each other.

Memory device 1900 can include data lines (e.g., read data lines) 1950, 1951, and 1952, each of which can be electrically coupled to channel region Ch1 of transistor T1 of a respective memory cell. Memory device 1900 can include data lines (e.g., write data lines) 1960, 1961, and 1962, each of which can be electrically coupled to channel region Ch1 of transistor T2 of a respective memory cell of memory device 1900. The operations (e.g., read and write) of memory device 1900 can be similar to those of memory device 900 (FIG. 9) and memory device 1000 (FIG. 10).

Figure 20A:
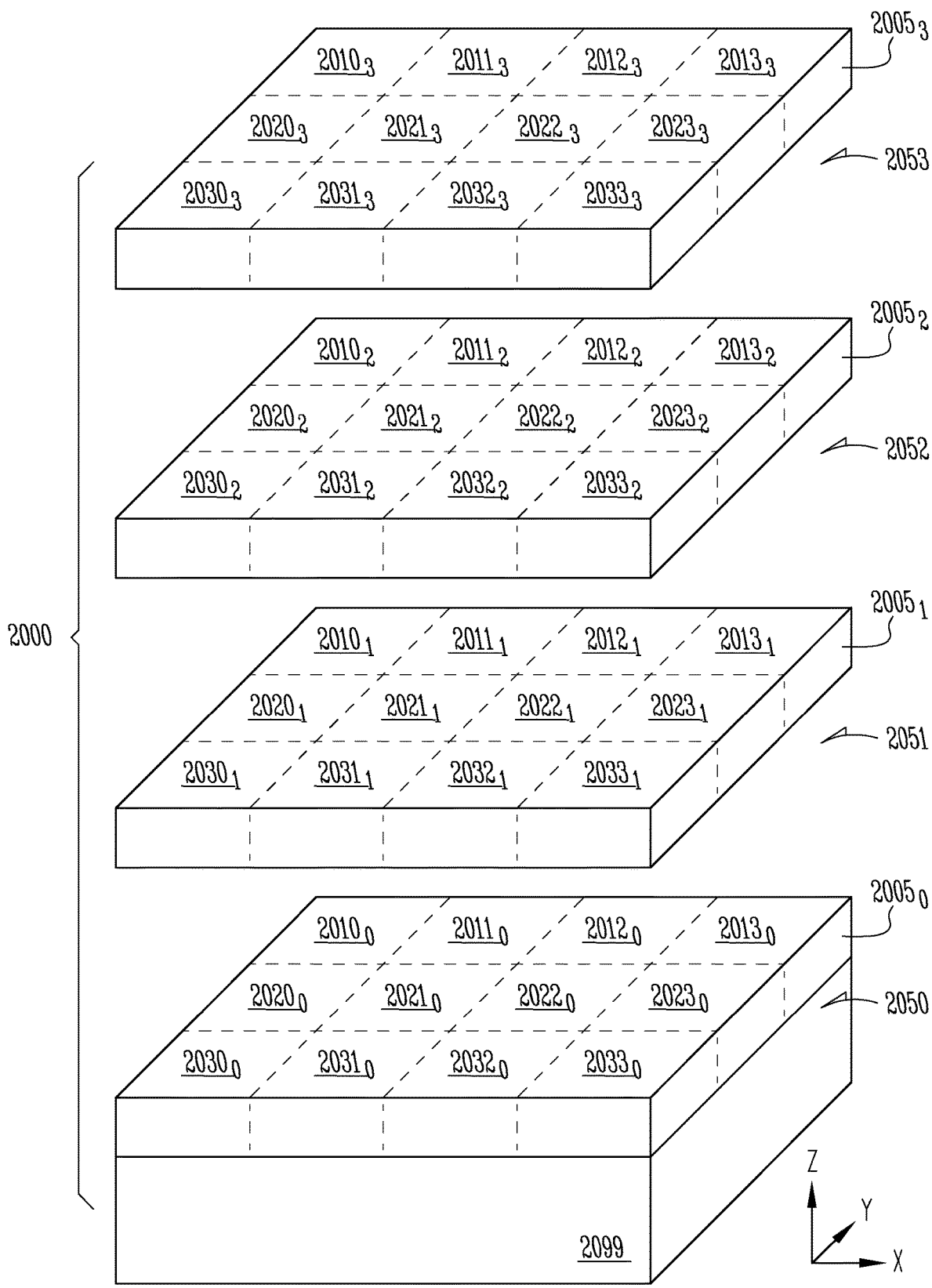
FIG. 20A, FIG. 20B, and FIG. 20C show different views of a structure of a memory device including multiple decks of memory cells, according to some embodiments described herein.
Figure 20B:
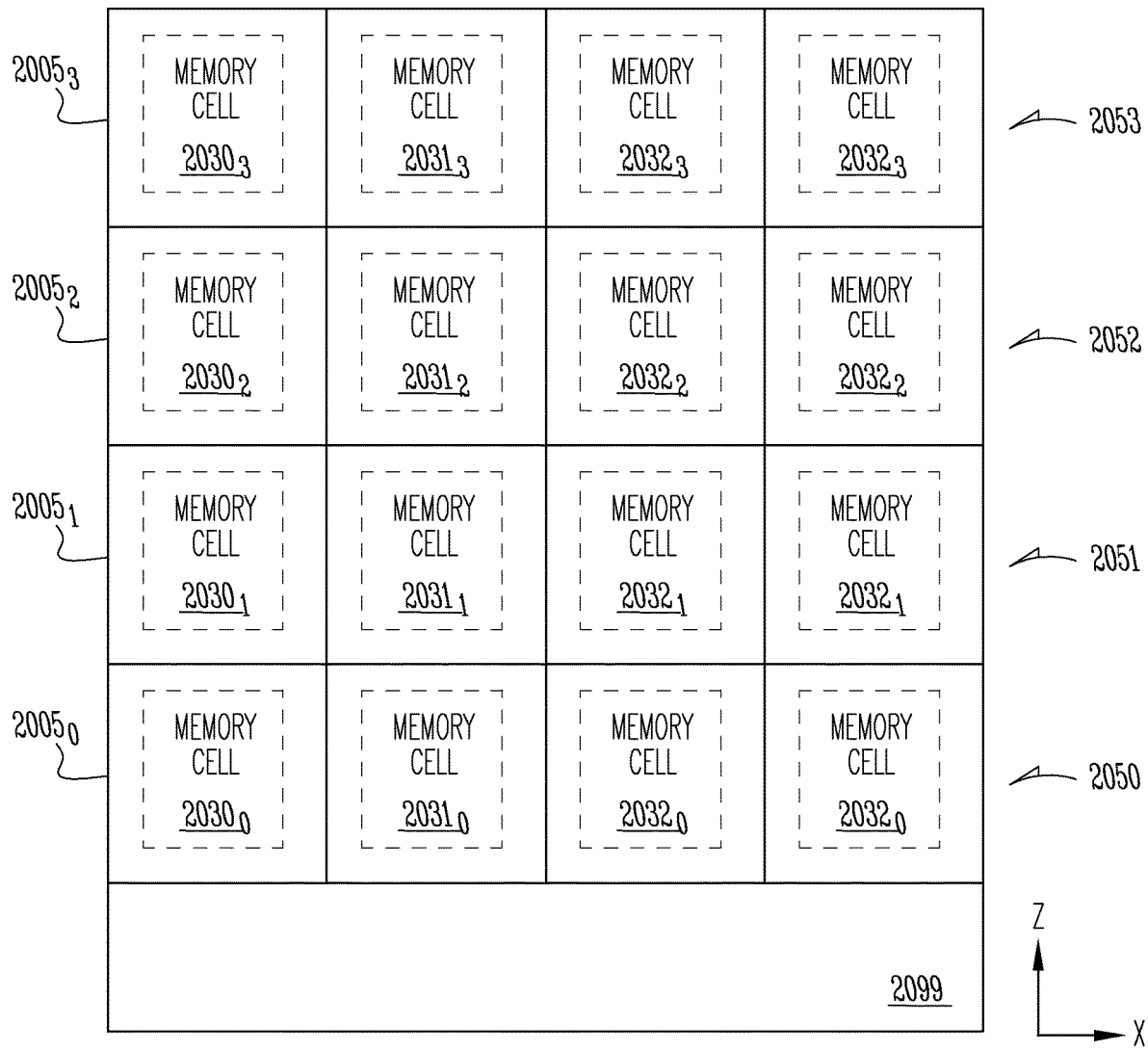
Figure 20C:
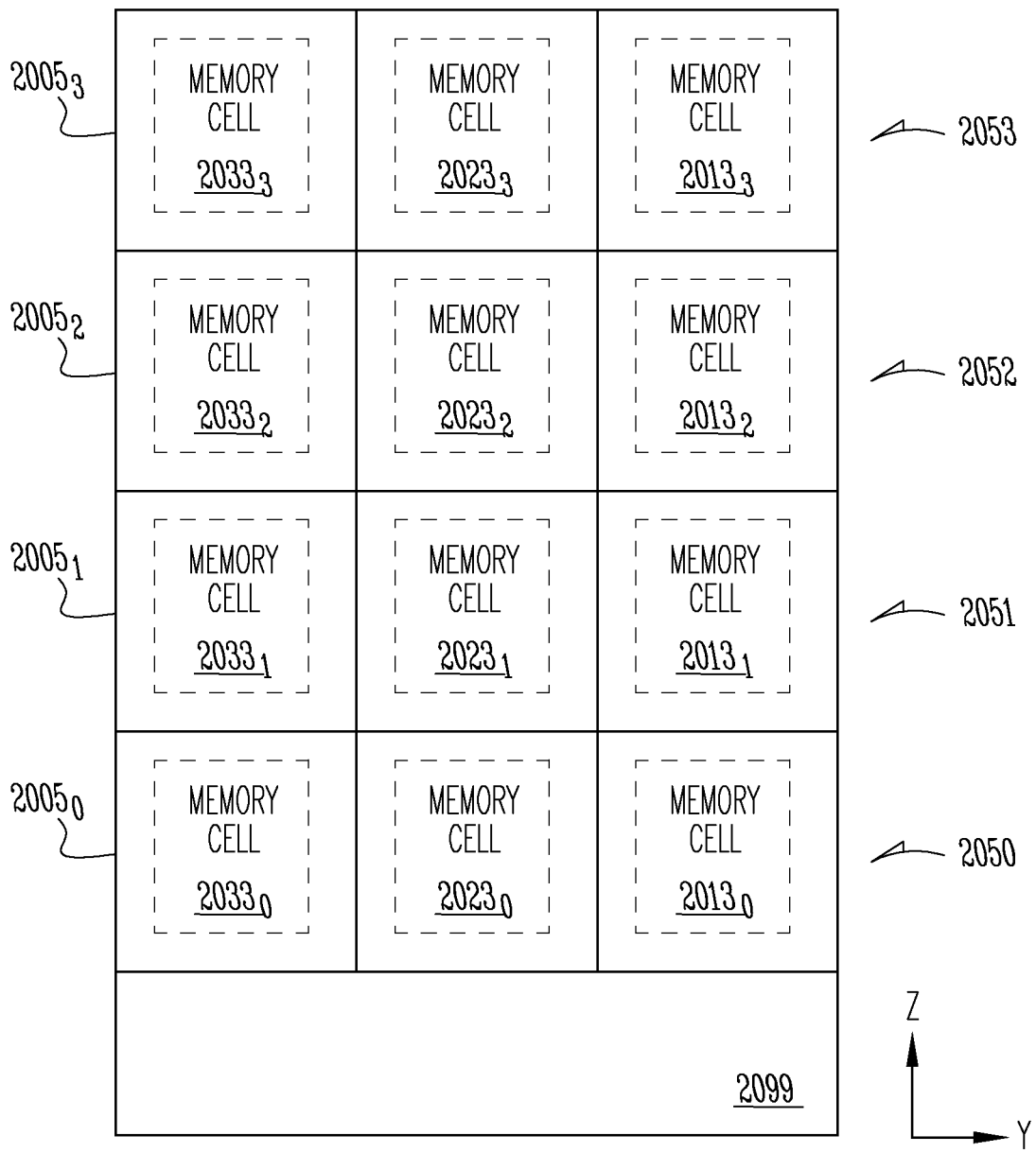

FIG. 20A, FIG. 20B, and FIG. 20C show different views of a structure of a memory device 2000 including multiple decks of memory cells, according to some embodiments described herein. FIG. 20A shows an exploded view (e.g., in the Z-direction) of memory device 2000. FIG. 20B shows a side view (e.g., cross-sectional view) in the X-direction and the Z-direction of memory device 200. FIG. 20C shows a side view (e.g., cross-sectional view) in the Y-direction and the Z-direction of memory device 2000.

As shown in FIG. 20A memory device 2000 can include decks (decks of memory cells) $2005_0$, $2005_1$, $2005_2$, and $2005_3$ that are shown separately from each other in an exploded view to help ease of viewing the deck structure of memory device 2000. In reality, decks $2005_0$, $2005_1$, $2005_2$, and $2005_3$ can be attached to each other in an arrangement where one deck can be formed (e.g., stacked) over another deck over a substrate (e.g., a semiconductor (e.g., silicon) substrate) 2099. For example, as shown in FIG. 20A, decks $2005_0$, $2005_1$, $2005_2$, and $2005_3$ can be formed in the Z-direction perpendicular to substrate 2099 (e.g., formed vertically in the Z-direction with respect to substrate 2099).

As shown in FIG. 20A, each of decks $2005_0$, $2005_1$, $2005_2$, and $2005_3$ can have memory cells arranged in the X-direction and the Y-direction (e.g., arranged in rows in the X-direction and in columns in the Y-direction). For example, deck $2005_0$ can include memory cells $2010_0$, $2011_0$, $2012_0$, and $2013_0$ (e.g., arranged in a row), memory cells $2020_0$, $2021_0$, $2022_0$, and $2023_0$ (e.g., arranged in a row), and memory cells $2030_0$, $2031_0$, $2032_0$, and $2033_0$ (e.g., arranged in a row).

Deck $2005_1$ can include memory cells $2010_1$, $2011_1$, $2012_1$, and $2013_1$ (e.g., arranged in a row), memory cells $2020_1$, $2021_1$, $2022_1$, and $2023_1$ (e.g., arranged in a row), and memory cells $2030_1$, $2031_1$, $2032_1$, and $2033_1$ (e.g., arranged in a row).

Deck $2005_2$ can include memory cells $2010_2$, $2011_2$, $2012_2$, and $2013_2$ (e.g., arranged in a row), memory cells $2020_2$, $2021_2$, $2022_2$, and $2023_2$ (e.g., arranged in a row), and memory cells $2030_2$, $2031_2$, $2032_2$, and $2033_2$ (e.g., arranged in a row).

Deck $2005_3$ can include memory cells $2010_3$, $2011_3$, $2012_3$, and $2013_3$ (e.g., arranged in a row), memory cells $2020_3$, $2021_3$, $2022_3$, and $2023_3$ (e.g., arranged in a row), and memory cells $2030_3$, $2031_3$, $2032_3$, and $2033_3$ (e.g., arranged in a row).

As shown in FIG. 20A, decks $2005_0$, $2005_1$, $2005_2$, and $2005_3$ can be located (e.g., formed vertically in the Z-direction) on levels (e.g., portions) 2050, 2051, 2052, and 2053, respectively, of memory device 2000. The arrangement of decks $2005_0$, $2005_1$, $2005_2$, and $2005_3$ forms a 3-dimensional (3-D) structure of memory cells of memory device 2000 in that different levels of the memory cells of memory device 2000 can be located (e.g., formed) in different levels (e.g., different vertical portions) 2050, 2051, 2052, and 2053 of memory device 2000.

Decks $2005_0$, $2005_1$, $2005_2$, and $2005_3$ can be formed one deck at a time. For example, decks $2005_0$, $2005_1$, $2005_2$, and $2005_3$ can be formed sequentially in the order of decks $2005_0$, $2005_1$, $2005_2$, and $2005_3$ (e.g., deck $2005_1$ is formed first and deck $2005_3$ is formed last). In this example, the memory cell of one deck (e.g., deck $2005_1$) can be formed either after formation of the memory cells of another deck (e.g., deck $2005_0$) or before formation of the memory cells of another deck (e.g., deck $2005_2$). Alternatively, decks $2005_0$, $2005_1$, $2005_2$, and $2005_3$ can be formed concurrently (e.g., simultaneously), such that the memory cells of decks $2005_0$, $2005_1$, $2005_2$, and $2005_3$ can be concurrently formed. For example, the memory cells in levels 2050, 2051, 2052, and 2053 of memory device 2000 can be concurrently formed.

The structures of the memory cells of each of decks $2005_0$, $2005_1$, $2005_2$, and $2005_3$ can include the structures of the memory cells described above with reference to FIG. 1 through FIG. 19B. For example, the structures of the of the memory cells of decks $2005_0$, $2005_1$, $2005_2$, and $2005_3$ can include the structure of the memory cells of memory devices 1100 and 1900.

Memory device 2000 can include data lines (e.g., bit lines) and access lines (e.g., word lines) to access the memory cells of decks $2005_0$, $2005_1$, $2005_2$, and $2005_3$. For simplicity, data lines and access lines of memory cells are omitted from FIG. 20A. However, the data lines and access lines of memory device 2000 can be similar to the data lines and access lines, respectively, of the memory devices described above with reference to FIG. 1 through FIG. 19B.

FIG. 20A shows memory device 2000 including four decks (e.g., $2005_0$, $2005_1$, $2005_2$, and $2005_3$) as an example. However, the number of decks can be different from four. FIG. 20A shows each of decks $2005_0$, $2005_1$, $2005_2$, and $2005_3$ including one level (e.g., layer) of memory cells as an example. However, at least one of the decks (e.g., one or more of decks $2005_0$, $2005_1$, $2005_2$, and $2005_3$) can have two (or more) levels of memory cells. FIG. 20A shows an example where each of decks $2005_0$, $2005_1$, $2005_2$, and $2005_3$ includes four memory cells (e.g., in a row) in the X-direction and three memory cells (e.g., in a column) in the Y-direction. However, the number of memory cells in a row, in a column, or both, can vary.

The illustrations of apparatuses (e.g., memory devices 100, 200, 600, 700, 800, 900, 1000, 1100, and 1900) and methods (e.g., operations of memory devices 100, 200, 600, 700, 800, 900, and 1000, and methods of forming memory devices 1100) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 600, 700, 800, 900, 1000, 1100, and 1900) or a system (e.g., an electronic item that can include any of memory devices 100, 200, 600, 700, 800, 900, 1000, 1100, and 1900).

Any of the components described above with reference to FIG. 1 through FIG. 19B can be implemented in a number of ways, including simulation via software. Thus, apparatuses (e.g., memory devices 100, 200, 600, 700, 800, 900, 1000, 1100, and 1900) or parts of each of these memory devices described above may all be characterized as "modules" (or a "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 600, 700, 800, 900, 1000, 1100, and 1900) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitors, blood pressure monitors, etc.), set-top boxes, and others.

The embodiments described above with reference to FIG. 1 through FIG. 19B include apparatuses and methods of forming the apparatuses. One of the apparatuses includes a memory cell, first, second, and third data lines, and first and second access lines. Each of the first, second, and third data lines include a length extending in a first direction and each of the first and second access lines includes a length extending in a second direction. The memory cell includes a first transistor including a charge storage structure, and a first channel region electrically separated from the charge storage structure, and a second transistor including a second channel region electrically coupled to the charge storage structure. The first data line is electrically coupled to the first channel region. The second data line is electrically coupled to the first channel region. The third data line is electrically coupled to the second channel region, the second channel region is between the charge storage structure and the third data line. The first access line is located on a first level of the apparatus and separated from the first channel by a first dielectric. The second access line is located on a second level of the apparatus and separated from the second channel by a second dielectric. The charge storage structure is located on a level of the apparatus between the first and second levels. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a memory cell including:
   a first transistor including a charge storage structure and a first channel region separated from the charge storage structure; and
   a second transistor including a second channel region coupled to the charge storage structure;
   a conductive region coupled to a first portion of the first channel region;
   a first data line coupled to a second portion of the first channel region;
   a second data line coupled to the second channel region, the second channel region being between the charge storage structure and the second data line, each of the first and second data lines including a length in a first direction;
   at least one access line including length in a second direction and separated from the first channel region and the second channel region; and
   a trench including a bottom, wherein the charge storage structure is formed in a first location of the trench, the second channel region is formed in a second location of the trench, and the charge storage structure is between the bottom of the trench and the second channel region.

2. The apparatus of claim 1, wherein the at least one access line includes:
   a first access line located on a first level of the apparatus and separated from the first channel region by a first dielectric material; and
   a second access line located on a second level of the apparatus and separated from the second channel region by a second dielectric material, and wherein the first data line is located on a third level of the apparatus, the first level being between the second and third levels.

3. The apparatus of claim 1, further comprising:
   an additional memory cell, the additional memory cell including:
   a first additional transistor including an additional charge storage structure, and a first additional channel region coupled to the conductive region and separated from the additional charge storage structure; and
   a second additional transistor including a second additional channel region coupled to the additional charge storage structure;
   a third data line coupled to the first additional channel region; and
   a fourth data line coupled to the second additional channel region, the second additional channel region being between the additional charge storage structure and the fourth data line, the third and fourth data lines including a length in the first direction, wherein the at least one access line includes a portion spanning across part of the first channel region and part of the first additional channel region.

4. The apparatus of claim 3, wherein the at least one access line includes:

a first access line located on a first level of the apparatus and separated from the first channel region by a first dielectric material; and a second access line located on a second level of the apparatus and separated from the second channel region by a second dielectric material, wherein:

the first access line includes the portion spanning across part of the first channel region and part of the first additional channel region; and the second access line includes a portion spanning across part of the second channel region and part of the second additional channel region.

5. The apparatus of claim 1, wherein the charge storage material and the second channel region include different materials.

6. An apparatus comprising:
a memory cell including:
a first transistor including a charge storage structure and a first channel region separated from the charge storage structure; and
a second transistor including a second channel region coupled to the charge storage structure;
a conductive region coupled to a first portion of the first channel region;
a first data line coupled to a second portion of the first channel region; and
a second data line coupled to the second channel region, the second channel region located over the charge storage structure and the second channel region being between the charge storage structure and the second data line.

7. The apparatus of claim 6, wherein the first and second transistors have different threshold voltages.

8. The apparatus of claim 6, wherein the first channel region includes:
a first portion located on a first side of the charge storage structure;
a second portion located on a second side of the charge storage structure; and
a third portion located between the charge storage structure and the substrate.

9. The apparatus of claim 6, wherein the first and second channel regions include different materials.

10. The apparatus of claim 6, wherein the charge storage structure includes a semiconductor material.

11. The apparatus of claim 6, wherein the charge storage structure includes metal.

12. The apparatus of claim 6, further comprising an access line shared by the first and second transistor.

13. The apparatus of claim 6, further comprising:
a first access line coupled to the first transistor; and
a second access line coupled to the second transistor.

14. The apparatus of claim 6, wherein the first channel region is to conduct current between the first and second portions of the first channel region during an operation performed on the memory cell.

15. An apparatus comprising:
a memory cell including:
a first transistor including a charge storage structure and a first channel region separated from the charge storage structure; and
a second transistor including a second channel region located over and coupled to the charge storage structure;
a first data line having a length in a first direction and coupled to the first channel region;
a second data line having a length in the first direction and coupled to the second channel region;
a conductive region coupled to the first channel region; and
at least one access line associated with at least one of the first and second transistors, the least one access line having a length in a second direction and located below the second data line.

16. The apparatus of claim 15, wherein the least one access line includes:
a first access line coupled to the first transistor; and
a second access line coupled to the second transistor.

17. The apparatus of claim 16, wherein the first and second access lines are separated from each other.

18. The apparatus of claim 17, wherein the first and second access lines are coupled to each other.

19. The apparatus of claim 15, wherein the first channel region is to conduct current between the first data line and the conductive region during an operation performed on the memory cell.

* * * * *